(12) United States Patent
Maruta et al.

(10) Patent No.: US 7,511,411 B2
(45) Date of Patent: Mar. 31, 2009

(54) LIGHT EMITTING DEVICE, PHOSPHOR, AND METHOD FOR PREPARING PHOSPHOR

(75) Inventors: Tadashi Maruta, Anan (JP); Hiroto Tamaki, Anan (JP)

(73) Assignee: Nichia Corporation, Tokushima (JP)

( * ) Notice: Subject to any disclaimer, the term of this patent is extended or adjusted under 35 U.S.C. 154(b) by 620 days.

(21) Appl. No.: 10/533,688

(22) PCT Filed: Nov. 7, 2003

(86) PCT No.: PCT/JP03/14233

§ 371 (c)(1),
(2), (4) Date: May 2, 2005

(87) PCT Pub. No.: WO2004/042834

PCT Pub. Date: May 21, 2004

(65) Prior Publication Data

US 2006/0001352 A1    Jan. 5, 2006

(30) Foreign Application Priority Data

Nov. 8, 2002   (JP) .............................. 2002-326155
Sep. 11, 2003  (JP) .............................. 2003-319668

(51) Int. Cl.
*H01J 1/62* (2006.01)

(52) U.S. Cl. ....................... 313/483; 313/486
(58) Field of Classification Search ......... 313/503–512, 313/483; 428/690, 404, 498
See application file for complete search history.

(56) References Cited

U.S. PATENT DOCUMENTS

| | | | |
|---|---|---|---|
| 5,856,009 A | 1/1999 | Nishio et al. | |
| 5,985,175 A | 11/1999 | Fan et al. | |
| 6,337,035 B1 | 1/2002 | Itoh et al. | |
| 6,417,019 B1 | 7/2002 | Mueller et al. | |
| 6,458,512 B1 | 10/2002 | Budd et al. | |
| 2002/0043926 A1 | 4/2002 | Takahashi et al. | |
| 2002/0105266 A1 | 8/2002 | Juestel et al. | |
| 2002/0150760 A1 | 10/2002 | Klinedinst | |

FOREIGN PATENT DOCUMENTS

EP    160856    11/1985

(Continued)

*Primary Examiner*—Vip Patel
(74) *Attorney, Agent, or Firm*—Wenderoth, Lind & Ponack, L.L.P.

(57) ABSTRACT

A surface of a phosphor particle is coated with a coating member made of a material that is different from the phosphor in chemical vapor-phase reaction. The coating member is made of any of metal oxide, metal nitride and metal oxynitride. The coating member coats the surface of the phosphor with a substantially smooth film, or is formed such that a large number of fine particles, which are relatively smaller than the phosphor particle, aggregate to coat the whole surface of the phosphor particle. The coating member contains at least one metallic element selected from the group including Al, Si, and rare earth elements. In addition, the phosphor is a transparent water-soluble phosphor and is an alkaline-earth silicon-nitride phosphor, an alkaline-earth silicon oxynitride phosphor, or the like. A BET value of the coated phosphor is 1.0 to 10 times the BET value before coating. The average thickness of the coating is 10 nm to 500 nm.

51 Claims, 8 Drawing Sheets

FOREIGN PATENT DOCUMENTS

| | | |
|---|---|---|
| EP | 0160856 | 2/1986 |
| JP | 7-5884 | 1/1995 |
| JP | 7-320645 | 12/1995 |
| JP | 07-320645 | 12/1995 |
| JP | 2002-33521 | 1/2002 |
| JP | 2002-173675 | 6/2002 |
| JP | 2002-188084 | 7/2002 |
| JP | 2003-34791 | 2/2003 |
| JP | 2003-034791 | 2/2003 |
| JP | 2003-286480 | 10/2003 |
| WO | 01/40403 | 6/2001 |
| WO | 02/089175 | 11/2002 |

(a)

(b)

(a)

(b)

ical Field of the Invention

LIGHT EMITTING DEVICE, PHOSPHOR, AND METHOD FOR PREPARING PHOSPHOR

BACKGROUND OF THE INVENTION

1. Technical Field of the Invention

The present invention relates to a light emitting apparatus including a light emitting element and a phosphor which converts the wavelength of light emitted from the light emitting element, a phosphor for a light emitting element, and a method for producing a phosphor. The present invention particularly relates to a light emitting apparatus including a semiconductor light emitting element, such as LED and LD, for example, and a nitride group phosphor which absorbs a part of light emitted from the light emitting element and converts it into light with wavelength different from the absorbed light.

2. Description of the Related Art

A light emitting apparatus has a structure for obtaining various types of chromaticity, such as white light, with a light emitting element which emits primary light, and a predetermined phosphor which absorbs a part of the primary light and emits secondary light the wavelength of which is longer than the primary light (for example, Patent Document 1). This type of light emitting apparatus mixes the light with converted wavelength and the light from the light emitting element the wavelength of which is not converted, and radiates the mixed light by the combination of the light emitting element and the predetermined phosphor. For example, a white LED light emitting apparatus, which has a blue light emitting diode (hereinafter, occasionally referred to as an "LED") and a phosphor member coating thereon, has been in actual use. The blue light emitting diode employing an $In_xAl_yGa_{1-x-y}N$ (0=x, 0=y, x+y=1) group material is used as a light emitting element. The phosphor member is composed of a transparent material, such as an epoxy resin, containing an Yttrium aluminum garnet (hereinafter, occasionally referred to as "YAG") group phosphor represented by the formula $(Y,Gd)_3(Al,Ga)_5O_{12}$. The luminescent color of the white LED light emitting apparatus is obtained based on the additive color mixture principle. After the blue light emitted from the LED enters into the phosphor member, it is repeatedly absorbed and scattered in its layer, and then is outwardly radiated. On the other hand, the blue light absorbed by the phosphor serves as an excitation source, and exhibits yellow fluorescence. Human eyes recognize the mixture of the yellow light from the phosphor and the blue light from the LED as white.

The LED light emitting apparatus using such an LED is small, high effective in terms of electric power consumption, and emits vivid color light. Since an LED is a semiconductor element, it is less prone to burn out. In addition, it has features, such as excellent initial drive characteristics, resistance to vibration or ON/OFF repeats. Since LEDs have these excellent characteristics, LED light emitting apparatuses are used as various kinds of light sources.

On the other hand, in phosphors used for these light emitting apparatuses, various technical improvements are made to improve their durability depending on their applications, or the like (for example, Patent Document 2).

Patent Document 1: Japanese Patent Laid-Open Publication TOKUKAI No. 2003-34791
Patent Document 2: Japanese Examined Publication TOKUKOU No. HEI 7-5884

SUMMARY OF THE INVENTION

However, in conventional light emitting apparatuses, in the case of application for lighting, there is a problem that it is difficult to obtain sufficient life. The main reason is that, under operating condition as lighting, light emitting apparatuses are placed in a severe state as compared with conventional apparatuses. For example, a phosphor deteriorates by strong light emitted from a light emitting element in the light emitting apparatuses, or is influenced by external heat, light, humidity, and so on, depending on situations where the light emitting apparatus is installed. This may cause short life.

The present invention is aimed at solving the problems. It is a first object of the present invention to provide a light emitting apparatus, a phosphor for a light emitting device, and a method for producing of a phosphor for a light emitting device, which suppress phosphor deterioration and have sufficient life.

In addition, in the aforementioned light emitting apparatus which emits white light, it is difficult to emit light with long wavelength side in the visible light range. Accordingly, such a light emitting apparatus emits slightly bluish white light which contains less reddish component. In particular, in lighting for display in shops, lighting for medical fields, or the like, light emitting apparatuses which emit reddish, warm color group white light is required. Additionally, as compared with conventional light bulbs, the light emitting element has generally long life, and is easy on human eyes. Accordingly, light emitting apparatuses, which emit white light near light bulbs, is strongly required.

Generally, when the reddish component increases, the light emission characteristic of light emitting apparatus deteriorates. In color that human eyes feel, electromagnetic radiation with wavelength of 380 nm to 780 nm range causes sensation of brightness. A characteristics of spectral luminous efficacy is given as one of indicator for representing this. The characteristics of spectral luminous efficacy is hill-shaped, and its peak is 550 nm. When electromagnetic radiation of the same condition indent, in the case of a wavelength range near 580 nm to 680 nm as a reddish component, and a wavelength range near 550 nm, human eyes recognize that the electromagnetic radiation of the wavelength range including reddish component causes less sensation. Accordingly, in the red range, high intensity incidence of electromagnetic radiation is required to cause sensation of brightness on human eyes as same as the green or blue range.

In addition, there are problems that conventional phosphors which emit red light do not have sufficient efficiency nor durability in excitation by near-ultraviolet to blue light, and additionally, luminescence efficiency sharply deteriorates when temperature becomes high.

The present invention is further aimed at solving the problems. It is a second object of the present invention to provide a nitride group phosphor, which has excellent thermal resistance and can emit light from the yellow to red range, and a light emitting apparatus, which has the nitride group phosphor.

The inventors of the present invention have diligently studied to achieve the above objects, and as a result developed the present invention. A light emitting apparatus according to the present invention, comprises a light emitting element, and a phosphor which absorbs a part of light emitted from said light emitting element and converts it into light with different wavelength. In this light emitting apparatus, the surface of said phosphor is coated with a coating member made of a material different from the phosphor, and said coating member is made of metal nitride or metal oxynitride.

In a light emitting apparatus according to another aspect of the present invention, said coating member coats the surface of said phosphor whereby having a substantially smooth film.

In a light emitting apparatus according to another aspect of the present invention said coating member is formed such that a large number of fine particles relatively smaller than said phosphor aggregate to coat the whole surface of said phosphor.

In a light emitting apparatus according to another aspect of the present Invention, said coating member contains at least one metallic element selected from the group consisting of Al, Si, and In, Ga and rare earth elements. For example, the coating member may be formed of a composite material with Al, Si, and so on.

In a light emitting apparatus according to another aspect of the present Invention, the phosphor before coating has hydration characteristics.

In a light emitting apparatus according to another aspect of the present Invention, said phosphor is an alkaline-earth silicon nitride phosphor.

In a light emitting apparatus according to another aspect of the present Invention, said phosphor is an alkaline-earth silicon oxynitride phosphor.

In a light emitting apparatus according to another aspect of the present Invention, the BET value of said coated phosphor is 1.0 to 10 times the BET value before coating.

In a light emitting apparatus according to another aspect of the present invention, the average thickness of said coating is 10 nm to 500 nm.

In a light emitting apparatus according to another aspect of the present invention, said coating is formed in chemical vapor deposition.

A phosphor for a light emitting element according to another aspect of the present invention absorbs a part of light emitted from the light emitting element and converts it into light with different wavelength. In this phosphor for a light emitting element, the surface of said phosphor is coated with a coating member made of a material different from the phosphor, and said coating member is made of metal nitride or metal oxynitride.

In a phosphor for a light emitting element according to another aspect of the present invention, said coating member coats the surface of said phosphor whereby having a substantially smooth film.

In a phosphor for a light emitting element according to another aspect of the present invention, said coating member is formed such that a large number of fine particles relatively smaller than the phosphor aggregate to coat the whole surface of said phosphor.

In a phosphor for a light emitting element according to another aspect of the present invention, said coating member contains at least one metallic element selected from the group consisting of Al, Si, and In, Ga and rare earth elements.

In a phosphor for a light emitting element according to another aspect of the present invention, the phosphor before coating has hydration characteristics.

In a phosphor for a light emitting element according to another aspect of the present invention, said phosphor is an alkaline-earth silicon nitride phosphor.

In a phosphor for a light emitting element according to another aspect of the present invention, said phosphor is an alkaline-earth silicon oxynitride phosphor.

In a phosphor for a light emitting element according to another aspect of the present invention, the BET value of said coated phosphor is 1.0 to 10 times the BET value before coating.

In a phosphor for a light emitting element according to another aspect of the present invention the average thickness of said coating is 10 nm to 500 nm.

In a phosphor for a light emitting element according to another aspect of the present invention, said phosphor is charged to a negative surface potential before coating.

In a phosphor for a light emitting element according to another aspect of the present invention, said coating is formed in chemical vapor deposition.

A method according to another aspect of the present invention is a method for producing a phosphor for a light emitting element which absorbs a part of light emitted from the light emitting element and converts it into light with different wavelength. This method comprises steps of adsorbing a reaction precursor onto the surface of the phosphor, and coating the surface of the phosphor with a metal nitride by reacting said reaction precursor with a coreaction material in chemical vapor deposition.

In a method for a phosphor for a light emitting element according to another aspect of the present invention, said reaction precursor is an organic metal.

In a method for a phosphor for a light emitting element according to another aspect of the present invention, said organic metal contains at least one metallic element selected from the group consisting of Al, Si, and In, Ga and rare earth elements.

In a method for a phosphor for a light emitting element according to another aspect of the present invention, said coreaction material is any of oxygen, water vapor and ammonia.

In a method for a phosphor for a light emitting element according to another aspect of the present invention, the method further comprises a step of thermally treating the phosphor for a light emitting element after coating in a non-oxidation atmosphere. In this case, it is possible to further improve smoothness of the surface condition after coating.

In a method for a phosphor for a light emitting element according to another aspect of the present invention, the temperature range of said thermal treatment is 150° C. to 1000° C., and the time is 3 to 10 hours.

In the case of coating the phosphor, phosphor can physically flow by a stirring rod or the like provided in a reaction vessel without using a flow agent. Since the phosphor can physically flow by a stirring rod provided without using a flow agent, the material formed on the surface of the phosphor is limited only to a target material. Thus, it is possible to provide effective coating.

In addition, when an organic metal is used as the reaction precursor, the reaction precursor can be provided in a gas state. Thus, it is possible to obtain uniform coating. Additionally, Al, Si, and rare earth elements can be used as metallic elements of the organic metal. Using one of, or two or more of these elements can provide excellent coating.

Oxygen, water vapor or ammonia is preferably used as the coreaction material. In addition, the phosphor may be thermally treated after coating. In this step, a by-product in coating can be volatilized.

This thermal treatment further improves smoothness of the surface condition after coating. It is preferable that thermal treatment is performed in a non-oxidation atmosphere, particularly in an ammonia atmosphere. Generally, thermal treatment after coating reduces luminance, but thermal treatment in an ammonia atmosphere can suppress deterioration of luminance. Although this reason is not clear, the reason is assumed that thermal treatment in an ammonia atmosphere produces an oxynitride.

It is preferable that thermal treatment is performed in a non-oxidation atmosphere at relatively low temperature of 150° C. to 1000° C. for relatively long time of 3 to 10 hours. This allows for a by-product to volatilize without damaging the phosphor, and allows for the surface of the coated phosphor to be close to that of before coating, and thus reduces damage of phosphor itself. Accordingly, it is possible to obtain the phosphor with effective coating.

To achieve the above objects, a nitride group phosphor according to another aspect of the present invention converts at least a part of light with first emission spectrum into light with at least one second emission spectrum in the range different from said first emission spectrum, and comprises a nitride group phosphor material (where N is nitrogen), and a coating material which is made of any of metal oxide, metal nitride and metal oxynitride and coats said nitride group phosphor material such that the BET value of the coated phosphor is 1.0 to 10 times the BET value before coating, and a coating material coating said nitride group phosphor material.

In a nitride group phosphor according to another aspect of the present invention, said coating material is a metal nitride group material, or a metal oxynitride group material. This construction provides a nitride group phosphor with thermal resistance capable of emitting light in a range from yellow to red.

In a nitride group phosphor according to another aspect of the present invention, said coating material forms a micro capsule. This construction provides a nitride group phosphor with thermal resistance capable of emitting light in a range from yellow to red.

In a nitride group phosphor according to another aspect of the present invention, said coating material has a multi-layer structure formed of a plurality of different materials.

In a nitride group phosphor according to another aspect of the present invention, said coating material of the multi-layer structure has a high refractive index on said phosphor side, and a low refractive index on the surface side.

In a nitride group phosphor according to another aspect of the present invention, said phosphor is a nitride group phosphor represented by L-M-N:R or L-M-O—N:R (where L contains at least one element selected from the group consisting of Be, Mg, Ca, Sr, Ba, and Zn; M contains at least one element selected from the group consisting of C, Si, Ge, Sn, Ti, Zr, and Hf; N is nitrogen; O is oxygen; and R is a rare earth element).

In a nitride group phosphor according to another aspect of the present invention, said phosphor is represented by $L_xM_yN_{\{(2/3)x+(4/3)y\}}$:R, or $L_xM_yO_zN_{\{(2/3)x+(4/3)y-(2/3)z\}}$:R (where L contains at least one element selected from the group consisting of Be, Mg, Ca, Sr, Ba, and Zn; M contains at least one element selected from the group consisting of C, Si, Ge, Sn, Ti, Zr, and Hf; N is nitrogen; O is oxygen; and R is a rare earth element); and has a crystal structure.

In a nitride group phosphor according to another aspect of the present invention, said phosphor is represented by $L_xM_yN_{\{(2/3)x+(4/3)y\}}$:R, or $L_xM_yO_zN_{\{(2/3)x+(4/3)y-(2/3)z\}}$: R (where $0.5 \leq x \leq 3$, $1.5 \leq y \leq 8$, $0 \leq z \leq 3$; L contains at least one element selected from the group consisting of Be, Mg, Ca, Sr, Ba, and Zn; M contains at least one element selected from the group consisting of C, Si, Ge, Sn, Ti, Zr, and Hf; N is nitrogen; O is oxygen; and R is a rare earth element), and has a crystal structure.

In a nitride group phosphor according to another aspect of the present invention, said phosphor is represented by $L_xM_yN_{\{(2/3)x+(4/3)y\}}$:R, or $L_xM_yO_zN_{\{(2/3)x+(4/3)y-(2/3)z\}}$:R (where $x=2$, $4.5 \leq y \leq 6.0$, $0.01 < z < 1.5$; $x=1$, $6.5 \leq y \leq 7.5$, $0.01 < z < 1.5$; or $x=1$, $1.5 \leq y \leq 2.5$, $1.5 \leq z \leq 2.5$; L contains at least one element selected from the group consisting of Be, Mg, Ca, Sr, Ba, and Zn; M contains at least one element selected from the group consisting of C, Si, Ge, Sn, Ti, Zr, and Hf; N is nitrogen; O is oxygen; and R is a rare earth element), and has a crystal structure.

In a nitride group phosphor according to another aspect of the present invention, said phosphor is represented by $Ca_2Si_5O_{0.1}N_{7.9}$:Eu, $Sr_2Si_5O_{0.1}N_{7.9}$:Eu, $(Sr_{0.5}Ca_{0.5})_2Sr_5O_{0.1}N_{7.9}$:Eu, $SrSi_2O_2N_2$:Eu, or $CaSi_2O_2N_2$:Eu, and has a crystal structure.

In a nitride group phosphor according to another aspect of the present invention, the crystal structure of said phosphor is a monoclinic system or orthorhombic system.

In a nitride group phosphor according to another aspect of the present invention, said phosphor contains a B element. A B element serves to increase the particle size of phosphor. Accordingly, this construction can improve the luminance of the phosphor of the present invention.

A light emitting apparatus according to another aspect of the present invention comprises a phosphor member composed of a transparent material containing a nitride group phosphor according to another aspect of the invention, and a light emitting element, wherein said phosphor member absorbs a part of light emitted from said light emitting element and emits light with different wavelength.

According to the present invention, it is possible to provide a light emitting apparatus, and so on, with sufficient life even under operating condition as lighting. The reason is that coating a phosphor improves thermal resistance, weather resistance and light resistance of the phosphor, and in addition reduces adverse effects on each light emitting element in the light emitting apparatus due to the phosphor. Accordingly, it is possible to improve life not only for a phosphor but also for light emitting apparatus under operating condition as lighting.

Additionally, according to the present invention, it is possible to provide a nitride group phosphor, which has excellent thermal resistance and can emit light from the yellow to red range, and a light emitting apparatus, which has the nitride group phosphor.

DETAILED DESCRIPTION OF THE INVENTION

Figure 1:
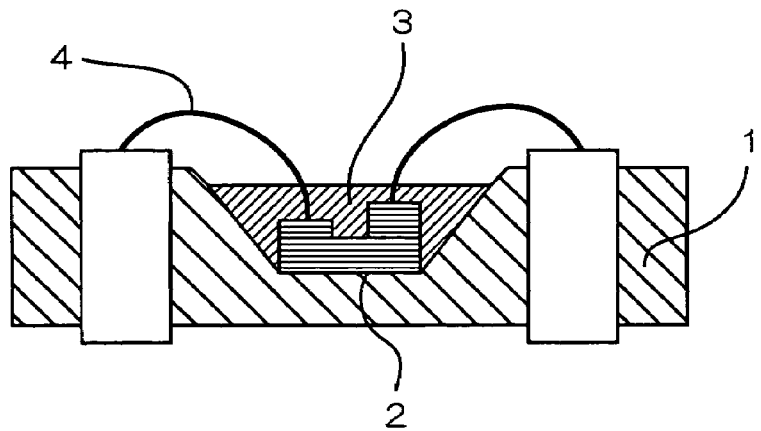
FIG. 1 is a schematic cross-sectional view showing a light emitting apparatus according to a first embodiment of the present invention.

The following description will describe embodiments according to the present invention with reference to the drawings. It should be appreciated, however, that the embodiments described below are illustrations of a light emitting apparatus, a phosphor, and a method for producing of a phosphor to give a concrete form to technical ideas of the invention, and a light emitting apparatus, a phosphor, and a method for producing of a phosphor of the invention are not specifically limited to description below.

Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the arrangement relationships of the members in each of drawings are occasionally shown larger exaggeratingly for ease of explanation. Members same as or similar to those of this invention are attached with the same designation and the same reference numerals and their description is omitted. In addition, a plurality of structural elements of the present invention may be configured as a single part which serves the purpose of a plurality of elements, on the other hand, a single structural element may be configured as a plurality of parts which serve the purpose of a single element.

LIGHT EMITTING APPARATUS ACCORDING TO FIRST EMBODIMENT

Figure 2:
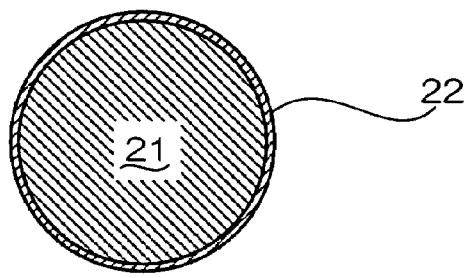
FIG. 2 is a schematic cross-sectional view showing a phosphor according to the first embodiment of the present invention.
Figure 3:
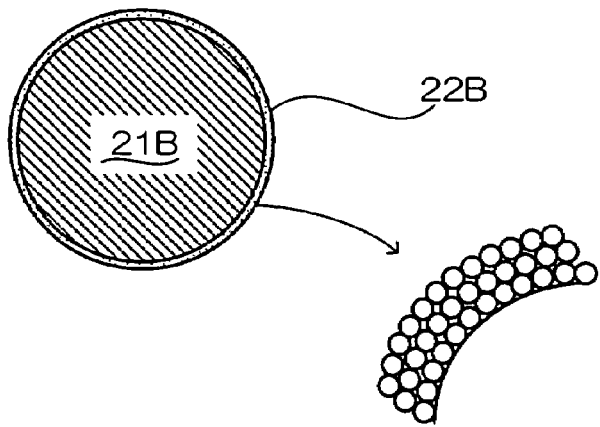
FIG. 3 is a schematic cross-sectional view showing another phosphor including an enlarged, principal part according to the first embodiment of the present invention.
Figure 4:
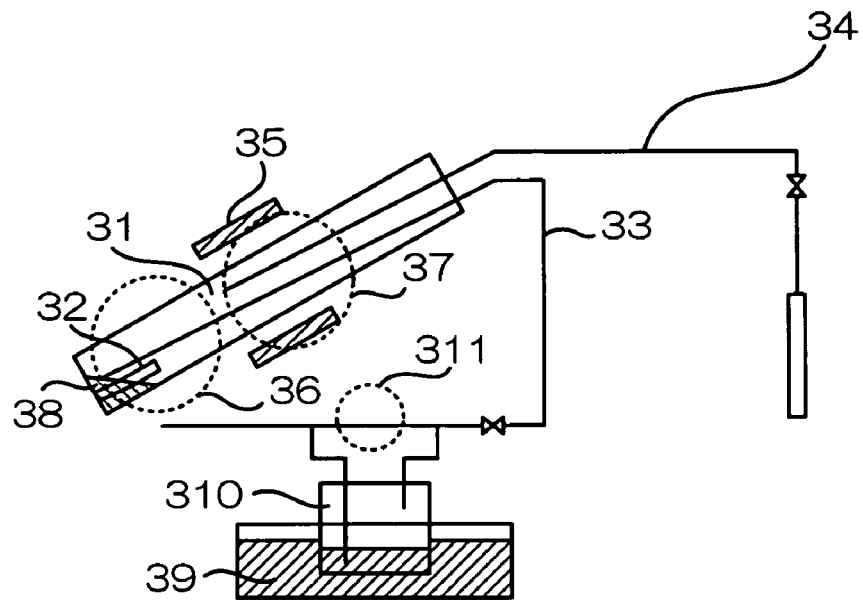
FIG. 4 is a schematic view showing an apparatus for producing a phosphor used for a method for producing a phosphor for a light emitting apparatus according to the first embodiment of the present invention.
Figure 5:
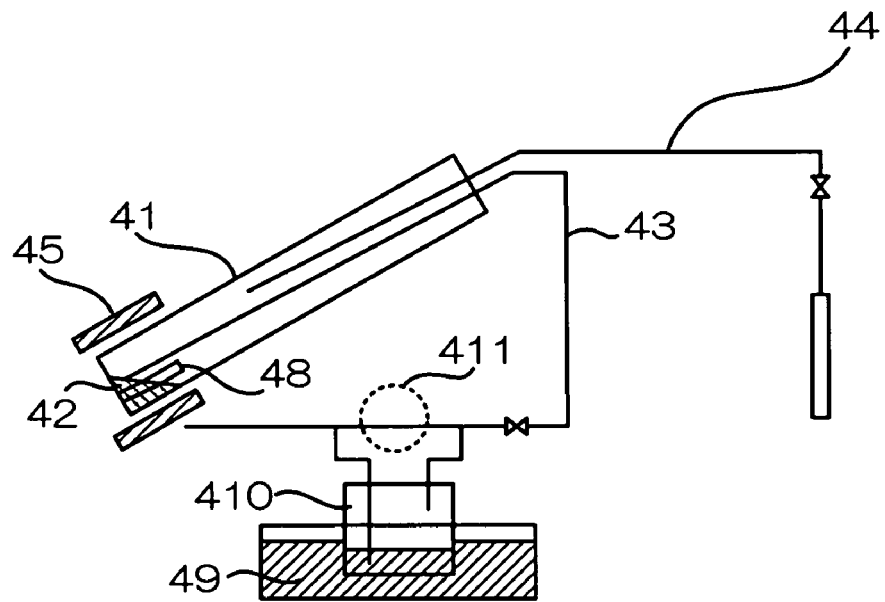
FIG. 5 is a schematic view showing another apparatus for producing a phosphor used for a method for producing a phosphor for a light emitting apparatus according to the first embodiment of the present invention.

FIG. 1 is a schematic cross-sectional view of a light emitting apparatus according to a first embodiment of the present invention. FIGS. 2 and 3 are schematic cross-sectional views of phosphors. FIGS. 4 and 5 are schematic views of producing apparatuses for coating the phosphor.

Light Emitting Element

In this specification, light emitting elements include semiconductor light emitting elements, such as a light emitting diode (LED) and a laser diode (LD), and elements for emitting light by vacuum discharge or calorescence. For example, ultraviolet rays by vacuum discharge or the like can be used as a light emitting element. In the first embodiment of the present invention, a light emitting element with wavelength 550 nm or less, preferably 460 nm or less, and more preferably 410 nm or less is used. For example, an ultraviolet light LED which emits light with wavelength of 250 nm to 365 nm as ultraviolet light, or a high-pressure mercury lamp with wavelength of 253.7 nm can be used. Particularly, as described later, in the first embodiment of the present invention, since the durability of the phosphor is improved, there is the advantage that it can be applied to a high power group light emitting element.

Various types of nitride semiconductor can be used as semiconductor layers which compose an LED or an LD. Specifically, a plurality of layers of types of semiconductor such as $In_xAl_yGa_{1-x-y}N$ ($0 \leq x$, $0 \leq y$, $x+y \leq 1$) are formed on a substrate in Metal-Organic Chemical Vapor Deposition (MOCVD), Hydride Chemical Vapor Deposition (HVPE), or the like. Homo structure, hetero structure, double-hetero structure, and so on with MIS junction, PIN junction or PN junction can be used as a laminated structure thereof. A superlattice structure can be applied to any layer. The active layer can have a single- or multi-quantum-well structure provided with thin layer(s) for quantum effect.

Generally, in formation of LED, semiconductor layers are grown on a particular substrate. In the case where an insulating substrate, such as sapphire, is used as the substrate, when the insulating substrate is not removed in the whole processes, p-side and n-side electrodes are usually formed on the semiconductor layers on the same surface side. In this structure, face-up mounting, that is, the semiconductor-layer side is disposed on the view side, can be used, and emitted light can outgo from the semiconductor-layer side. Alternatively, face-down mounting, that is, the substrate side is disposed on the view side, can be used, and emitted light can outgo from the substrate side. Of course, the substrate may be finally removed. In this structure, face-up mounting or face-down mounting can be also used. In addition, the substrate is not limited to sapphire, but known members, such as spinel, SiC, GaN, and GaAs can used as the substrate.

In this embodiment, a group III nitride semiconductor light emitting element is described as an exemplary light emitting element. For example, a light emitting element has a laminated structure formed above the sapphire substrate so as to interpose a GaN buffer layer between them. In the laminated structure, a first n-type GaN layer, an n-type contact layer, a second GaN layer, a light emitting layer, a p-cladding layer, and a p-type contact layer are successively laminated. The first n-type GaN layer is undoped, or has a low concentration of Si. The n-type contact layer is formed of n-type GaN doped with Si, or n-type GaN which has an Si concentration higher than the first n-type GaN layer. The second GaN layer is undoped, or has an Si concentration lower than the n-type contact layer. The light emitting layer has a multi-quantum-well structure (quantum-well structure with sets of GaN barrier layer/InGaN well layer). The p-cladding layer is formed of p-type GaN doped with Mg. The p-type contact layer is formed of p-type GaN doped with Mg. Electrodes are formed as follows. It is needless to say that a light emitting element different from this construction can be used.

A p-ohmic electrode is formed on the substantially whole surface of the p-type contact layer. A p-pad electrode is formed on a part of the p-ohmic electrode.

A part of n-type contact layer is exposed by removing the first GaN layer from the p-type contact layer by etching. An n-electrode is formed on the exposed part.

Although the light emitting layer of multi-quantum-well structure is used in the first embodiment, the present invention is not limited to this construction. For example, a single-quantum-well structure or multi-quantum-well structure with InGaN may be used. In addition, GaN doped with Si, Zn, or the like may be used.

Varying content of In can vary the main peak wavelength of light emission by the light emitting layer of the light emitting element within a range between 420 and 490 nm. The wavelength of light emission is not limited to the above range, but a light emitting layer with wavelength between 360 and 550 nm can be used. Particularly, when the light emitting apparatus of the present invention is applied to an ultraviolet LED light emitting apparatus, the absorption-and-conversion efficiency of excitation light can be improved. Accordingly, it is possible to reduce penetrating ultraviolet light.

In the semiconductor light emitting apparatus according to the first embodiment shown in FIG. 1, a semiconductor light emitting element 2 is mounted in a central recessed portion of a package 1, and the electrodes of the light emitting element 2 and terminals of the package 1 are connected with wires 4. A predetermined amount of binder in which the phosphor is dispersed is put in the recessed portion of the package 1, thus a phosphor layer 3 is formed. A part of light emitted from the semiconductor light emitting element 2 penetrates the phosphor layer 3. Other part is converted into light with longer wavelength by the phosphor layer 3. Accordingly, the combination of the penetrating light and the converted light provide light radiated by the semiconductor light emitting apparatus. Adjustment of the phosphor layer 3 provides semiconductor light emitting apparatus with various types of chromaticity, such as white.

LIGHT EMITTING APPARATUS ACCORDING TO SECOND EMBODIMENT

Figure 10:
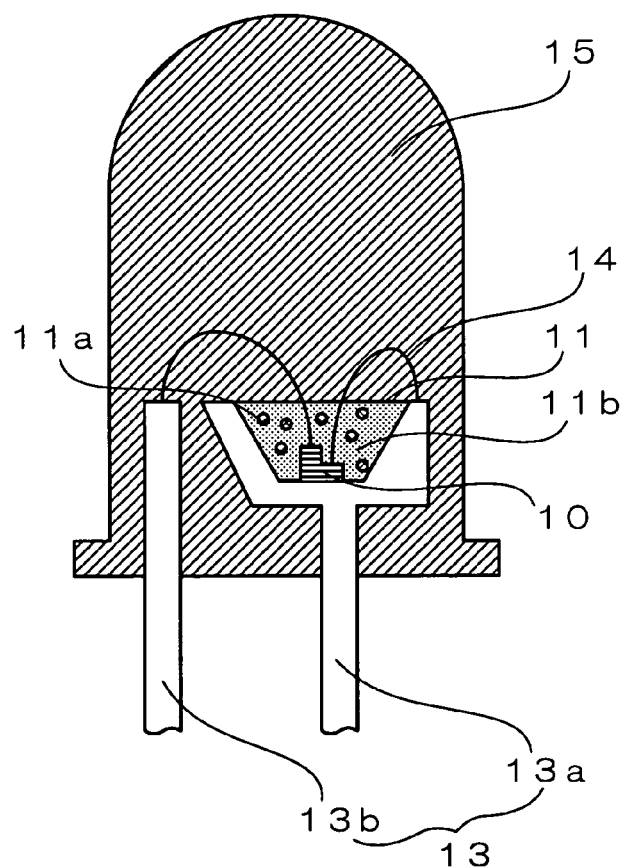
FIG. 10 is a schematic view showing a light emitting apparatus according to a second embodiment of the present invention.

FIG. 10 shows a light emitting apparatus according to a second embodiment. This light emitting apparatus has a light emitting element 10, a nitride group phosphor 11a which includes a nitride group phosphor material represented by L-M-N:R or L-M-O—N:R (where L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element) and a coating material containing an N element for coating the nitride group phosphor material, and a phosphor member 11 composed of a transparent material 11b which includes the nitride group phosphor 11a.

The light emitting element 10 composed of an LED, for example, is mounted in a substantially central part of a cup disposed on the upper part of a mount lead 13a by die-bonding. The electrodes formed in the light emitting element 10 are electrically connected to the mount lead 13a and an inner lead 13b of a lead frame 13 with conductive wires 14. The phosphor member 11 including the nitride group phosphor 11a composed of the nitride group phosphor material, which absorbs a part of light emitted from the light emitting element 10 and converts it into light with wavelength different from the absorbed light, and the coating material containing an N element for coating the nitride group phosphor material in the transparent material 11b is provided in the cup into which the light emitting element 10 is mounted. As mentioned above, in order to protect the LED chip and the phosphor material from external stress, moisture, dust, and so on, the lead frame 13 in which the light emitting element 10 and the phosphor member 11 are provided is molded with a mold member 15, thus, the light emitting apparatus is formed. The same type of light emitting element used in the aforementioned first embodiment can be used as the light emitting element 10.

Phosphor

The phosphors used in the above first and second embodiments converts visible light or ultraviolet light emitted from the light emitting element into light with different wavelength. The phosphor is used as a wavelength conversion material which emits light with wavelength longer than the wavelength of absorbed light. Mixing colors of light emitted from the light emitting element and light converted by the phosphor can externally radiate desired light. The phosphor is transparent, and is excited by the light emitted from the semiconductor light emitting layer in the LED, and thus emits light. Phosphors of YAG group activated by cerium, zinc sulfide coactivated by silver and aluminum, nitride group such as alkaline-earth silicon-nitride phosphor, and oxynitride group phosphors such as alkaline-earth silicon oxynitride phosphor can be used as a preferable phosphor. In the second embodiment, a phosphor, which is excited by ultraviolet light and emits light of a desired color, is used as the phosphor.

In the first embodiment of the present invention, even if the phosphor has characteristics that is easily hydrated with solvents, such as water, or is water-soluble material that is prone to be solved, coating described later allows for such a phosphor to be used as an insoluble substance. In this specification, phosphors with hydration characteristics are not necessary to be completely solved with water, but include a phosphor in which a component element of the phosphor is partially solved or is eluted due to hydration on the surface of the phosphor. In a nitride group phosphor basically represented by L-M-N:R or L-M-O—N:R (where L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), it can be suitably used by coating.

In an aluminate group, apatite group, or silicate group phosphor basically represented by L-Mg—Al—O:R, L-P—O—H:R, L-Al—O:R, and L-Si—O:R (where L contains at least one element selected from the group consisting of Be, Mg, Ca, Sr, Ba, and Zn, M contains at least one element selected from the group consisting of C, Si, Ge, Sn, Ti, Zr, and Hf, H is a halogen element, Mg is magnesium, P is phosphorus, Al is aluminum, Si is silicon, R is a rare-earth element), it can be also suitably used by coating as the above water-soluble phosphor. As mentioned above, the first embodiment of the present invention has an excellent feature that coating allows for even water-soluble phosphors to be suitably used as an insoluble substance.

More specifically, for example, a barium magnesium aluminate group phosphor activated by europium represented by $BaMgAl_{10}O_{17}$:Eu, a calcium halophosphate group phosphor activated by europium represented by $(Ca, Sr, Ba)_5(PO_4)_3Cl$:Eu, an alkaline-earth chloroborate group phosphor activated by europium represented by $(Ca, Sr, Ba)_2B_5O_9Cl$:Eu, an alkaline-earth aluminate group phosphor activated by europium represented by $(Sr, Ca, Ba)Al_2O_4$:Eu or $(Sr, Ca, Ba)_4Al_{14}O_{25}$:Eu, an alkaline-earth silicon oxynitride group phosphor activated by europium represented by $(Mg, Ca, Sr, Ba)Si_2O_2N_2$:Eu, an alkaline-earth magnesium silicate group phosphor activated by europium represented by $(Ba, Ca, Sr)_2SiO_4$:Eu, a YAG group phosphor which is a rare earth aluminate represented by $(Y, Gd)_3(Al, Ga)_5O_{12}$:Ce or the like, and a rare-earth oxychalcogenide group phosphor activated by europium represented by $(Y, La, Gd, Lu)_2O_2S$:Eu, and so on, can be used as the phosphor. The barium magnesium aluminate group phosphor activated by europium is composed of growth particles with a substantially hexagonal shape as the regular shape of crystal growth, and emits light in the blue range. The calcium halophosphate group phosphor activated by europium is composed of growth particles with a substantially spherical shape as the regular shape of crystal growth, and emits light in the blue range. The alkaline-earth chloroborate group phosphor activated by europium is composed of growth particles with a substantially cubical shape as the regular shape of crystal growth, and emits light in the blue range. The alkaline-earth aluminate group phosphor activated by europium emits light in the bluish green range. The alkaline-earth silicon oxynitride group phosphor activated by europium emits light in the green range. The alkaline-earth magnesium silicate group phosphor activated by europium emits light in the green range. The YAG group phosphor emits light in the yellow range. The rare-earth oxychalcogenide group phosphor activated by europium is composed of growth particles with a substantially spherical shape as the regular shape of crystal growth, and emits light in the red range. But, the phosphor is not limited to these materials. A sulfide group phosphor treated against deterioration, and the like, may be used.

In the aforementioned phosphors, such as the alkaline-earth chloroborate group phosphor activated by the europium, the alkaline-earth aluminate group phosphor activated by the europium, the alkaline-earth silicon oxynitride group phosphor activated by the europium, the YAG group phosphor, and the alkaline-earth silicon nitride group phosphor activated by the europium, for example, it is preferable that they contain a B element, so that their crystallinity becomes excellent, their particle sizes become large, and their crystal shape is adjusted. This can improve luminance of light emission. In addition, in the other phosphors, when they contain a B element, this can also achieve similar effects.

A nitride group phosphor activated by Eu and/or a rare-earth element including N, selectively including O, and including at least one element selected from the group consisting of Be, Mg, Ca, Sr, Ba, and Zn, and at least one element selected from the group consisting of C, Si, Ge, Sn, Ti, Zr, and Hf is preferably used as the phosphor. That is, it is a crystalline phosphor composition elements of which is basically represented by L-M-N:R, or L-M-O—N:R. As for the crystal structure, for example, $Ca_2Si_5N_8$ has a monoclinic system, $Sr_2Si_5N_8$ and $(Sr_{0.5}Ca_{0.5})_2Sr_5N_8$ have a orthorhombic system, and $Ba_2Si_5N_8$ has a monoclinic system.

More specifically, it is a phosphor generally represented by $L_xM_yN_{\{(2/3)x+(4/3)y\}}$:R, or $L_xM_yO_zN_{\{(2/3)x+(4/3)y-(2/3)z\}}$:R. Where L is at least one element selected from the group consisting of Be, Mg, Ca, Sr, Ba, and Zn, M is at least one element selected from the group consisting of C, Si, Ge, Sn, Ti, Zr, and Hf, N is nitrogen, O is oxygen, and R is a rare earth element. The phosphor may contain Eu, and other elements such as Mg, B, Mn, Cr and Ni, in its composition.

In addition, this phosphor includes 60% or more of, preferably 80% or more of crystalline substance in its composition. Typically, it is preferable that x=2, y=5 or x=1, y=7, but arbitrary values can be used.

In a very small amount of additive, B, or the like, can improve crystallinity without reducing light emission characteristics. Mn, Cu, and so on, also achieve a similar effect. In addition, La, Pr, and so on, are effective for improving light emission characteristics. In addition, Mg, Cr, Ni, and so on, have an effect that makes persistence short, thus, they are used if necessary. In addition, elements which are not shown in this specification can be added without reducing luminance remarkably, if their concentrations are within a range about 10 to 1000 ppm.

It is preferable that at least one element of Y, La, Ce, Pr, Nd, Gd, Tb, Dy, Ho, Er, and Lu is included as the rare earth element contained in R. But, R, Sc, Sm, Tm, or Yb may be included. Additionally, B, Mn, and so on, other than the above elements have an effect that improve luminance, thus, they may be included. These rare-earth elements are mixed in the material as single substance, oxide, imide, amide, or other states. Although rare earth elements mainly have a stable trivalent configuration, Yb, Sm, and so on, can also have a divalent configuration, and Ce, Pr, Tb, and so on, can also have a tetravalent configuration. When a rare earth element oxide is used, oxygen affects light emission characteristics of the phosphor. In other words, when oxygen is included, light emission luminance may reduce. But, when Mn is used, the particle size becomes larger due to the flux effect of Mn and O, thus, it is possible to improve light emission luminance.

Europium Eu which is a rare earth element is preferably used as a luminescence center. Europium mainly has divalent and trivalent energy levels. In the phosphor of the present invention, $Eu^{2+}$ is used as an activation agent for an alkaline-earth-metal group silicon nitride as a base material. $Eu^{2+}$ tends to oxidize and is usually used as a trivalent composition of $Eu_2O_3$. However, in this $Eu_2O_3$, O affects the characteristics much. Accordingly, it is difficult to obtain an excellent phosphor. For that reason, it is more preferable to use a material in which O is removed from $Eu_2O_3$ outwardly of the system. For example, it is preferable to use europium as a single substance or europium nitride, except in the case where Mn is added.

Specifically, examples of basic composition elements are given as follows: $Ca_2Si_5O_{0.1}N_{7.9}$:Eu, $Sr_2Si_5O_{0.1}N_{7.9}$:Eu, $(Ca_aSr_{1-a})_2Si_5O_{0.1}N_{7.9}$:Eu and $CaSi_7O_{0.5}N_{9.5}$:Eu in which Mn and B are added; $Ca_2Si_5O_{0.5}N_{7.9}$:Eu, $Sr_2Si_5O_{0.5}N_{7.7}$:Eu and $(Ca_aSr_{1-a})_2Si_5O_{0.1}N_{7.9}$: Eu in which rare earth is added; or the like.

In addition, the following examples can be produced: $Sr_2Si_5N_8$:Eu, Pr; $Ba_2Si_5N_8$:Eu, Pr; $Mg_2Si_5N_8$:Eu, Pr; $Zn_2Si_5N_8$:Eu, Pr; $SrSi_7N_{10}$:Eu, Pr; $BaSi_7N_{10}$:Eu, Ce; $MgSi_7N_{10}$:Eu, Ce; $ZnSi_7N_{10}$:Eu, Ce; $Sr_2Ge_5N_8$:Eu, Ce; $Ba_2Ge_5N_8$:Eu, Pr; $Mg_2Ge_5N_8$:Eu, Pr; $Zn_2Ge_5N_8$:Eu, Pr; $SrGe_7N_{10}$:Eu, Ce; $BaGe_7N_{10}$:Eu, Pr; $MgGe_7N_{10}$:Eu, Pr; $ZnGe_7N_{10}$:Eu, Ce; $Sr_{1.8}Ca_{0.2}Si_5N_8$:Eu, Pr; $Ba_{1.8}Ca_{0.2}Si_5N_8$: Eu, Ce; $Mg_{1.8}Ca_{0.2}Si_5N_8$:Eu, Pr; $Zn_{1.8}Ca_{0.2}Si_5N_8$:Eu, Ce; $Sr_{0.8}Ca_{0.2}Si_7N_{10}$:Eu, La; $Ba_{0.8}Ca_{0.2}Si_7N_{10}$:Eu, La; $Mg_{0.8}Ca_{0.2}Si_7N_{10}$:Eu, Nd; $Zn_{0.8}Ca_{0.2}Si_7N_{10}$:Eu, Nd; $Sr_{0.8}Ca_{0.2}Ge_7N_{10}$:Eu, Tb; $Ba_{0.8}Ca_{0.2}Ge_7N_{10}$:Eu, Tb; $Mg_{0.8}Ca_{0.2}Ge_7N_{10}$:Eu, Pr; $Zn_{0.8}Ca_{0.2}Ge_7N_{10}$:Eu, Pr; $Sr_{0.8}Ca_{0.2}Si_6GeN_{10}$:Eu, Pr; $Ba_{0.8}Ca_{0.2}Si_6GeN_{10}$:Eu, Pr; $Mg_{0.8}Ca_{0.2}Si_6GeN_{10}$:Eu, Y; $Zn_{0.8}Ca_{0.2}Si_6GeN_{10}$:Eu, Y; $Sr_2Si_5N_8$:Pr; $Ba_2Si_5N_8$:Pr; $Sr_2Si_5N_8$:Tb; $BaGe_7N_{10}$:Ce; or the like. However, the present invention is not limited to these examples. Similarly, it is, of course, conceivable that the phosphors represented by these general formulas can have suitable elements, such as a third component, a fourth component, and a fifth component, if desired.

The nitride group phosphor discussed above absorbs a part of blue light emitted from the light emitting element, and emits light in the range from yellow to red. This phosphor is used for the light emitting apparatus of the aforementioned construction, thus, it is possible to provide a light emitting apparatus which radiates warm, white light by mixing colors of blue light emitted from the light emitting element and red light of the phosphor. Particularly, in a white light emitting apparatus, the apparatus preferably includes a nitride group phosphor, and an yttrium aluminum oxide phosphor material activated by cerium which is a rare-earth aluminate phosphor. The reason is that, when the apparatus includes the above yttrium aluminum oxide phosphor material, it is possible to adjust desired chromaticity. The yttrium aluminum oxide phosphor material activated by cerium can absorb a part of blue light emitted from the light emitting element, and emit light in the yellow range. In this case, bluish white light can be radiated by mixing the color of blue group light emitted from the light emitting element, and the color of light of the yttrium aluminum oxide phosphor material. Accordingly, the phosphor, which has the transparent member mixed with the yttrium aluminum oxide phosphor material and the aforementioned phosphor together, blue light emitted by the light emitting element are combined, thus, it is possible to provide a warm, white light emitting apparatus. In this warm, white light emitting apparatus, the general color rendering index Ra can be 75 to 95, and the color temperature can be 2000 K to 8000 K. Especially, it is preferable that a white light emitting apparatus, which has a high general color rendering index Ra, and the color temperature of which is located on the blackbody line in the chromaticity diagram. In order to provide a light emitting apparatus with desired color temperature and general color rendering index, the amounts of combination of the yttrium aluminum oxide phosphor material and the phosphor, or the composition ratio of phosphors can be changed if necessary. Particularly this warm white light emitting apparatus is aimed at improving the special color rendering index R9. In a conventional light emitting apparatus which is composed of the combination of a blue light emitting element and an yttrium aluminum oxide phosphor material activated with cerium and emits white light, the special color rendering index R9 is low, and the reddish component is insufficient. Accordingly, there was a problem to be solved that the special color rendering index R9 was improved. On the other hand, in the present invention, the phosphor is included in the yttrium aluminum oxide phosphor material activated by cerium, thus, the special color rendering index R9 can be increased to the range 40 to 70.

Generally, since particle growth of a phosphor was difficult, in the case where their shapes were adjusted in a spherical shape, the obtained average particle size was 3 μm, at most. When they grew to be large, numbers of very small particles were included depending on processing.

The average particle size of phosphor is 3 μm or more, preferably 5 μm to 15 μm, and more preferably 10 μm to 12 μm. Very small phosphor is classified and removed by means, such as classification, such that particles with particle size of 2 μm or less occupy not more than 10% in volume distribution. Accordingly, light emission luminance can be improved. Additionally, chromaticity variation depending on the orientation of light is reduced by reducing the number of particles with a particle size of 2 μm or less.

Method for Producing Nitride Group Phosphor

Figure 11:
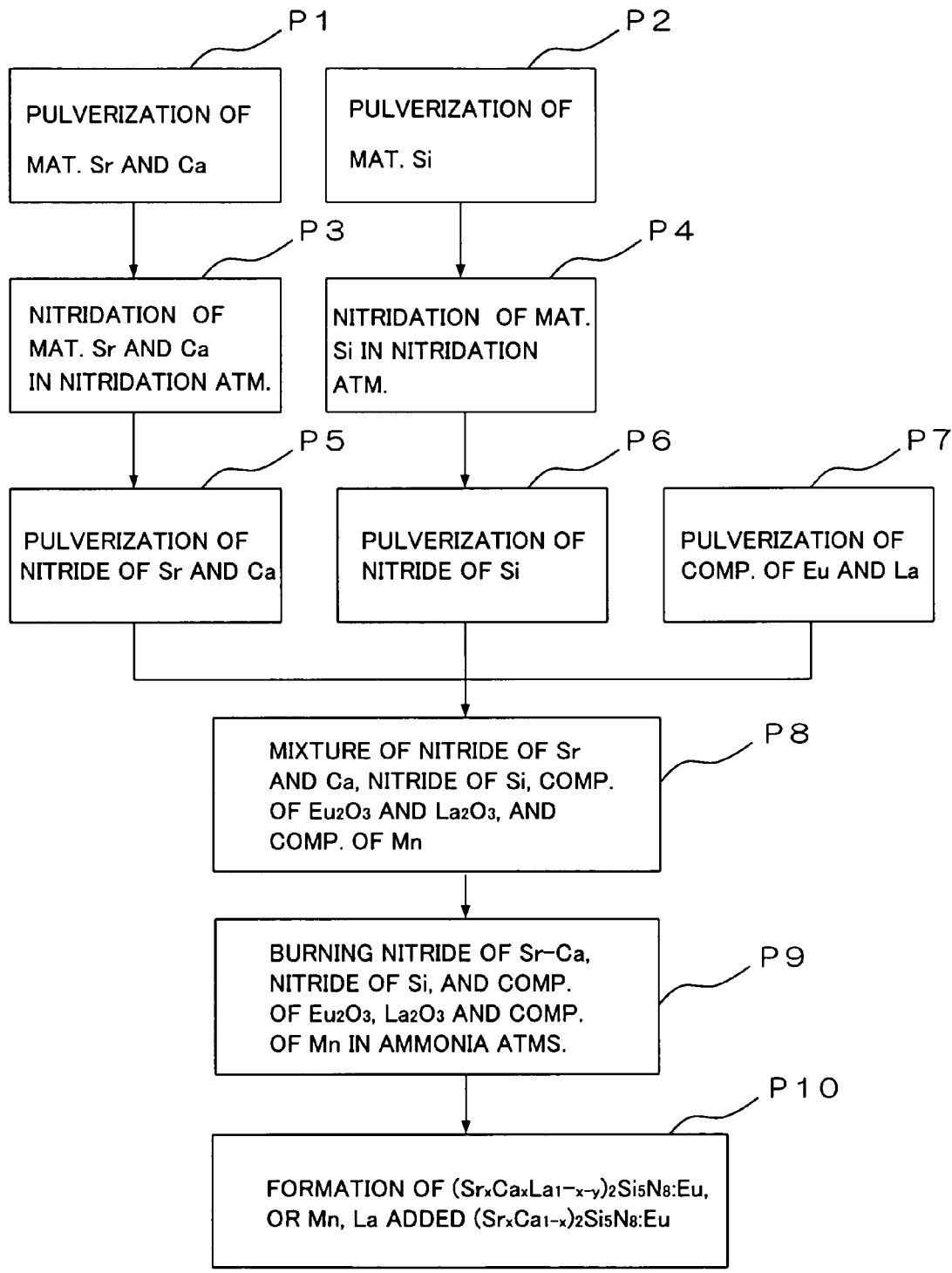
FIG. 11 is a flow chart showing processes for producing a nitride group phosphor according to the second embodiment of the present invention.

With reference to FIG. 11, method for producing $(Sr_a, Ca_{1-a})_x Si_y O_z N_{\{(2/3)x+(4/3)y-(2/3)z\}}$:Eu, where x=2, and y=5, as a preferable nitride group phosphor is now described. However, the nitride group phosphor used for the present invention is not limited to this method for producing it. The above phosphor preferably includes Mn.

First, materials Sr and Ca are pulverized (P1). Although it is preferable to use the materials Sr and Ca as a single material, compounds, such as an imido compound and an amide compound, can be used. It is preferable that Sr and Ca obtained by pulverization have the average particle size of about 0.1 μm to 15 μm, but they are not limited to this range. In addition, it is preferable that the purities of Sr and Ca are 2N or more, but they are limited to this degree.

On the other hand, a material Si is pulverized (P2). Although it is preferable to use the material Si as a single material, compounds, such as a nitride compound, an imido compound and an amide compound, can be used. The material may contain compounds, such as manganese oxide, $H_3BO_3$, $B_2O_3$, $Cu_2O$, and CuO.Si is pulverized in an argon atmosphere or nitrogen atmosphere, in a glove box, similarly to the materials Sr and Ca. It is preferable that the average particle size of Si compound is about 0.1 μm to 15 μm.

Subsequently, the materials Sr and Ca are nitrided in a nitrogen atmosphere (P3). This reaction formula is shown in Reaction Formula 1.

$3Sr+N_2 \rightarrow Sr_3N_2$ Reaction Formula 1

$3Ca+N_2 \rightarrow Ca_3N_2$

Sr and Ca are nitrided at 600° C. to 900° C. in a nitrogen atmosphere for about 5 hours. As for Sr and Ca, they may be mixed and nitrided, or they may be nitrided separately. Thus, nitrides of Sr and Ca can be obtained. The nitrides of Sr and Ca preferably have a high purity, but commercially available nitrides can also be used.

The material Si is nitrided in a nitrogen atmosphere (P4). This reaction formula is shown in Reaction Formula 2.

$3Si+2N_2 \rightarrow Si_3N_4$ Reaction Formula 2

Silicon Si is also nitrided at 800° C. to 1200° C. in a nitrogen atmosphere for about 5 hours. Thus, a silicon nitride can be obtained. The silicon nitride used for the present invention preferably has a high purity, but commercially available silicon nitride can also be used.

The nitrides of Sr and Ca, or Sr—Ca nitride is pulverized in a nitrogen atmosphere (P5). The nitrides of Sr and Ca, or Sr—Ca nitride is pulverized in an argon atmosphere or nitrogen atmosphere, in a glove box. Similarly, the nitride of Si is pulverized (P6).

In addition, $Eu_2O_3$ as a compound of Eu, and $La_2O_3$ as a compound of La of are pulverized, similarly (P7). It is preferable that the average particle sizes of nitride of alkaline earth metal, silicon nitride, and europium oxide after pulverization are about 0.1 μm to 15 μm.

Small amounts of impurity elements may be included in the aforementioned materials to some extent not to affect characteristics and/or to improve crystallinity. After the aforementioned pulverization, nitrides of Sr and Ca, or Sr—Ca nitride, the nitride of Si, $Eu_2O_3$ as a compound of Eu, $La_2O_3$ as a compound of La, and a compound of Mn are added and mixed (P8).

Finally, mixture of nitrides of Sr and Ca, or Sr—Ca nitride and the nitride of Si, $Eu_2O_3$ as a compound of Eu, and $La_2O_3$ as a compound of La are burned in an ammonia atmosphere (P9). A phosphor represented by Sr—Ca—Si—O—N:Eu, La in which Mn is added can be obtained by the burning (P10). This reaction formula of basic composition elements in the burning is shown in Reaction Formula 3. In this case, the content of Mn is 100 ppm or less.

$(x/3)Sr_3N_2+(1.96x/3)Ca_3N_2+(5/3)Si_3N_4+(0.03/2)$
$Eu_2O_3+(0.01/2)La_2O_3 \rightarrow Sr_xCa_{1.96-x}Eu_{0.03}La_{0.01}Si_5O_{0.05}N_{7.78}$ Reaction Formula 3

In addition, varying blend ratio of materials can change a composition of target phosphor.

Although the burning can be performed at burning temperature of a range 1200° C. to 1700° C., the burning temperature is preferably in a range 1400° C. to 1700° C.

The phosphor is formed as mentioned above, thus, aggregated, burned phosphor material is obtained. Pulverizing this material can provide a nitride group phosphor composed of phosphor particles with a fracture surface. The fracture surface refers to a surface on which an irregular polygon or spherical surface, or an oblique surface is partially or substantially entirely formed by fracture of phosphor. In this specification, occasionally, phosphor particles with the fracture surfaces are referred to as fracture particles, on the other hand, phosphor particles without the fracture surface are referred to as growth particles. Providing the fracture surfaces on the phosphor can suppress chromaticity and luminance variations depending on orientation.

The fracture surfaces are entirely or partly formed on the phosphor particles. However, it is not necessary to provide the fracture surfaces on all phosphor particles. Adjusting the extent of the fracture of the phosphor provides mixture of phosphor particles with the fracture surfaces, and phosphor particles without the fracture surfaces formed thereon. Alternatively, growth particles may be mixed with formed fracture particles. In this case, the fracture particles and the growth particles may have different compositions of phosphors. The phosphor is formed or adjusted so as to partially have the fracture surfaces, thus, it is possible to obtain an effect that reduces chromaticity and luminance variations depending on orientation as mentioned above. The phosphor formed as above is classified with a screen, or by using the difference in sedimentation characteristics. This classification preferably achieves that the average particle size is 3 µm or more, and the particles with a particle size of 2 µm or less occupy 10% or less in volume distribution measured by particle-size-distribution.

Coating

According to the first invention of the present invention, coating the phosphor with a coating member can improves thermal resistance, weather resistance and light resistance, and in addition can reduce adverse effects on each light emitting element in the light emitting apparatus due to the phosphor. Coating refers to forming a substance different from the phosphor on the surfaces of the particles in the phosphor to coat the surfaces of the particles. Although there is difference in the extent of the effect by coating depending on phosphors, particularly, the effect for the nitride phosphor is remarkable. A metal oxide or metal nitride is preferable as a material for coating. Particularly, in a phosphor with coating uniformly formed on the whole surface of the phosphor, coating exerts the effect. It is preferable that coating is uniformly applied to the surface of the phosphor. The coating may be a thin film or aggregation of very small particles with particle size of 1 nm to 10 nm as long as it is uniform. Although various processes for obtaining uniform coating can be used, uniform coating for phosphor can be easily obtained by using chemical vapor-phase reaction among them.

A BET value can evaluate the surface state of coating. The phosphor with a BET value that is about 1.0 to 10 times the value before coating, preferably 1.0 to 3.0 times, exhibits excellent thermal resistance, weather resistance and light resistance, and less affects each element in the light emitting apparatus.

In a phosphor coated with coating the thickness of which is 10 nm to 500 nm, preferably 10 nm to 100 nm, more preferably 10 nm to 50 nm, the above effects can be obtained. When it is 10 nm or less, the above effects by coating are not obtained. When it exceeds 500 nm, the luminescence intensity of phosphor reduces. For this reason, it is preferable to adjust the thickness within the above range.

A method of using a vapor-phase material, a method of using a liquid phase material, or the like, can be used as a method of coating other than the chemical vapor-phase reaction discussed later. Alternatively, a sol-gel method for obtaining coating of silicon oxide by hydrolysis of ethyl silicate may be used. Such a sol-gel method can be preferably used for a phosphor principally consisting of silica.

In addition, as another coating method, a material of metallic element, a coreaction material and the phosphor may be stirred in a solution, then a target coating substance may be adhered on the surface of the phosphor. Or, as still another coating method, an intermediate may be adhered, and then burned in a nitrogen atmosphere to obtain desired coating.

Additionally, very small particles of a substance used as coating and phosphor may be stirred at high speed, then the very small particles of coating substance can be electrostatically adhered on the surface of the phosphor.

A multilayer can be coated by using one or more aforementioned processes. When the phosphor is charged to a negative surface potential before coating, coating can be easy. Accordingly, when a process for charging the phosphor to a negative surface potential is employed as pretreatment, a coating process can be easy. A method other than a CVD process can be used as the pretreatment.

When the water-soluble phosphor was coated and then dipped in water, it was confirmed that the phosphor became insoluble. Since it was confirmed that even the water-soluble phosphor could be insoluble by coating, the moisture resistance was improved when the phosphor was stored, for example. Therefore, long-term storage is available.

In addition, coating can prevent the phosphor from dissolved as an ion, and achieves an effect that suppresses reaction between a dissolved ion and resin.

Coating of Coating Material Containing N Element over Phosphor

The embodiment in which the nitride group phosphor material is coated with a coating material containing an N element will be described. The aforementioned nitride group phosphor material has excellent water resistance, acid resistance, and alkali resistance, but is prone to deteriorate by baking. For this reason, in the nitride group phosphor according to the second embodiment of the present invention, the nitride group phosphor material is coated with the coating material containing an N element. Metal nitride group materials containing nitrogen and metals, such as aluminum, silicon, titanium, boron and zirconium, and organic resins containing an N element, such as polyurethane and the polyurea, can be used as the coating material containing an N element.

In the case of a metal nitride group material, CVD for forming an aluminum nitride disclosed by U.S. Pat. No. 6,064,150 can be given as an example of a method for forming the coating material. For example, a coating material composed of a metal nitride group material including a metal nitride, such as AlN, or a metal oxynitride, such as AlON, can be formed over the nitride group phosphor material in a heating furnace with a fluid bed by using CVD. Additionally, metal nitride group materials can be formed as the coating material over the nitride group phosphor particles by using metal alkyls, such as alkyl silane, and nitrogen compounds, such as ammonia. In the case of silicon nitride group material, silane can also be used as a silicon supply source. In this specification, the metal nitride group materials refers not only to metal nitrides but also to metal compounds, such as metal oxynitrides of aluminum silicon, titanium, boron, zirconium, gallium and hafnium, and so on, containing an N element. AlN, GaN, $Si_3N_4$, BN, $Ti_3N_4$, $Zr_3N_4$, and $Hf_3N_4$ and so on can be given as a composition formula. In addition, although a-sialon or β-sialon group oxynitride, various types of oxynitride glass, or a material of the same type as phosphor composition may be used as a coating material, the present invention is not limited to these materials.

In addition, urea, aluminum water solution, and the nitride group phosphor material are thermally stirred in a solvent, and these materials are adhered on the surface of the nitride group phosphor material. They are then burned in a nitrogen atmosphere, thus, a coating material composed of an aluminum nitride or an aluminum oxynitride can be also formed in a film shape. Additionally, urea, aluminum water solution, and the nitride group phosphor material may be thermally stirred in a solvent, and these materials can be adhered on the surface of the nitride group phosphor material. They can be then burned in a nitrogen atmosphere by plasma burning, thus, a coating material composed of an aluminum nitride or an aluminum oxynitride can be also formed in a film shape.

Furthermore, a metal nitride group material film and an oxide material film, such as metal oxide, may be formed over the nitride group phosphor material. In this case, it is preferable that the metal nitride group material film is formed on the nitride group phosphor material side, and the oxide material film is formed on the outside. The reason is that nitrogen can be more effectively provided to the nitride group phosphor material. In addition, it is more preferable that films of metal nitride, metal oxynitride and oxide, such as AlN, AlON and $Al_2O_3$ are formed in this order from the nitride group phosphor material side, particularly, these films are formed as gradient films. Additionally, when the nitride group phosphor material is coated with a plurality of coating material films which include at least one coating material film containing an N element, it is preferable that the materials are formed from the nitride group phosphor material in decreasing order of refractive index. The reason is that light emitted from the phosphor material can easily outgo.

Moreover, the metal nitride group material can be formed in low-temperature CVD reaction by using a compound containing a metal-nitrogen bond. Methylamino complexes of aluminum, silicon, titanium, boron, and zirconium (for example, tetrakis dimethylamino titanium) can be given as compounds containing a metal-nitrogen bond. In addition, a nitride metal group material may be formed as a coating material by using a coating method, such as deposition, sputtering, mechanical alloying, atmosphere burning after sedimentation. Polyurea and polyurethane can be formed by internal in-situ polymerization or an interfacial polymerization.

Although the nitride group phosphor material obtained by the producing method mentioned above could improve the efficiency and durability of excitation by near-ultraviolet to blue light as compared with a conventional phosphor which emits red light, its luminescence efficiency sharply reduced in high temperature, particularly from about 200° C. to 300° C. As the reason that the luminescence efficiency of the nitride group phosphor material sharply reduces in the high temperature, it is conceivable that nitrogen in the nitride group phosphor material decomposes. These coating materials containing an N element can reduce such decomposition of nitrogen in the nitride group phosphor material by providing nitrogen. Although such an effect can be obtained as long as the coating material coats at least a part of nitride group phosphor particle, particularly, it is preferable that it is formed as a microcapsule which coats the whole particle.

Phosphor Member

The phosphor member 11 is a member obtained by mixing the phosphor 11a for converting light emitted from light emitting element 10 and transparent material 11b, and is preferably provided in the cup of the mount lead 13a. Transparent resins with excellent temperature characteristics and weather resistance, such as epoxy resin, urea resin, and silicone resin, silica sol, glass, inorganic binder, and so on can be used as an exemplary material of the transparent material (coating member) 11b. The phosphor member 11 may include a barium titanate, a titanium oxide, an aluminum oxide, a silicon dioxide, a calcium carbonate, or the like, as a filler (diffusion agent) together with the phosphor. In addition, the phosphor member 11 may include a light stabilizing material, a coloring agent, and an ultraviolet absorption agent.

It is preferable that the phosphor member 11 further includes a filler with average particle size 1 μm or more and 10 μm or less, and the average particle size of the phosphor is 5 μm or more and 15 μm. Accordingly, increasing the average particle size of the phosphor can improve the luminance of light emission, in addition, the filler can reduce the chromaticity variation depending on the orientation of light due to the increased average particle size of the phosphor.

Light Emitting Apparatus

The light emitting element (LED chip) 10 with a semiconductor which composes at least a light emitting portion, for example, is preferably mounted in a substantially central part of the cup disposed on the upper part of the mount lead 13a by die-bonding. The lead frame 13 is composed of, for example, copper containing iron. The electrodes formed on the light emitting element 10 are electrically connected to the lead frame with the conductive wires 14. Gold is used for the conductive wire 14. Ni is preferably plated on bumps for electrically connecting the electrodes and the conductive wires 14.

The phosphor member 11, which is slurry obtained by sufficiently mixing the aforementioned phosphor 11a with the transparent material 11b composed of, for example, an epoxy resin, is put in the cup in which the light emitting element 10 is mounted. If the phosphor member 11 included in the transparent material 11b contains numbers of very small particles with size of 1 μm or less as the phosphor particles, the very small particles aggregate to a particular part, such as the wire and the slurry surface of the transparent member 11b. This causes the chromaticity variation. This tendency is remarkable, particularly, in a phosphor which has the light specific gravity and has fracture surfaces. Since such very small particles have high self-absorption, and their luminescence efficiency is low, it is preferable to remove these small particles. In the light emitting apparatus according to the second embodiment of the present invention, the phosphor member 11 includes phosphor particles the average particle size of which is 3 μm or more, and in which particles with particle size of 2 μm or less occupy 10% or less in volume distribution. Accordingly, it is possible to obtain effects that improve orientation characteristics, and further improves luminescence efficiency.

After that, an epoxy resin including the phosphor 11a is heated and cured. Thus, the phosphor member 11 composed of the transparent material including the phosphor is formed on the LED chip 10, and the LED chip 10 is fastened. Subsequently, in order to protects the LED chip and the phosphor from external stress, moisture, dust, and so on, a transparent epoxy resin is preferably further formed as the mold member 15. The lead frame 13 is inserted into a mold with a bullet-shaped cavity in which the color transformation member is formed. Then, the transparent epoxy resin is mixed therein, and cured. Thus, the mold member 15 is formed.

The phosphor member 11 may be provided such that it is in direct contact with the LED chip 10, or such that a transparent resin, or the like, is interposed between them. Needless to say, in this case, it is preferable to use a transparent resin with high light resistance.

In the nitride group phosphor according to the second embodiment of the present invention, even in the case where it is placed under high temperature environment during reflow of the light emitting apparatus, and so on, it is possible to reduce that the luminescence efficiency sharply reduces.

Particularly, in a light emitting element in which its lead is contact with or close to the phosphor member, and heat is prone to being highly conducted to the phosphor through the lead, the nitride group phosphor according to the second embodiment of the present invention is useful.

Coating Material

Figure 12:
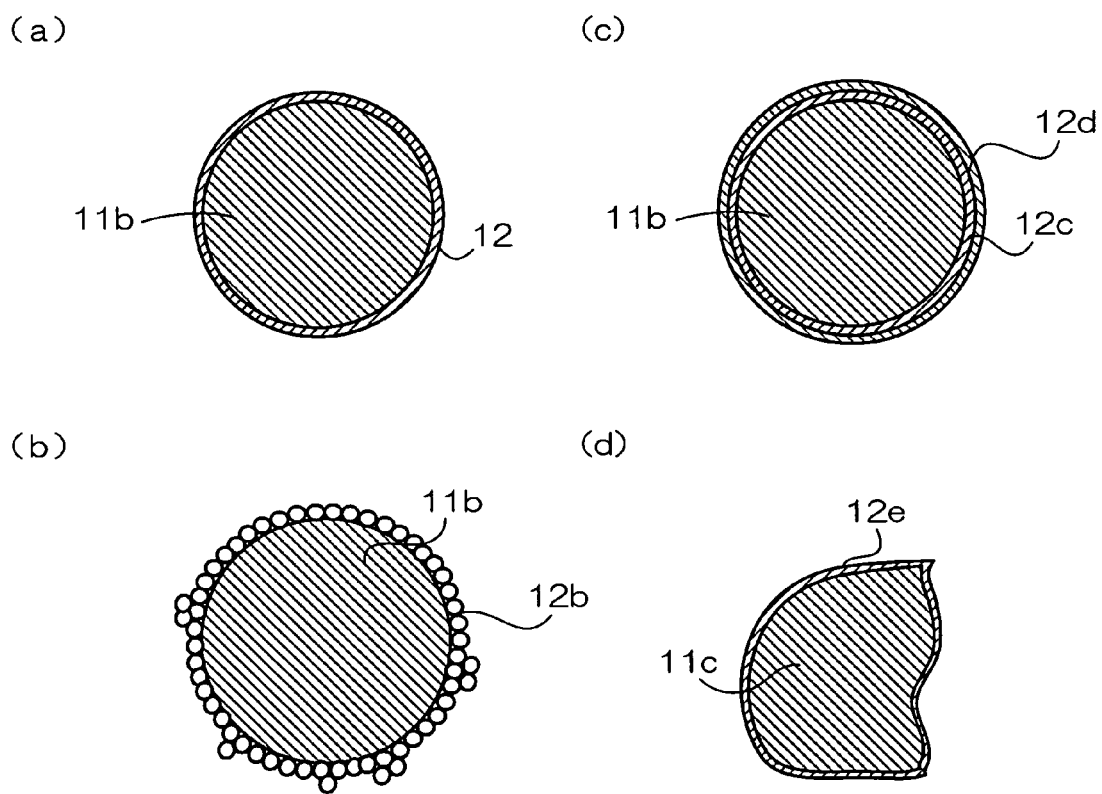
FIG. 12 is a cross-sectional view showing the phosphor according to the second embodiment of the present invention.

FIG. 12 shows the states where the phosphor particles are coated with a coating material. FIG. 12(a) shows the state where the phosphor particles 11b are coated with the film-shaped coating material 12. FIG. 12(b) shows the state where the phosphor particles 11b are coated with the particle-shaped coating material 12. As shown in these figures, the coating material can be a microcapsule for coating as a film-shape material, or a microcapsule for coating as a particles-shape material. In addition, FIG. 12(c) shows an example in which such a microcapsule is composed of a multi-layer structure. In the case where the coating member is composed of a multi-layer structure, as mentioned above, the refractive index of the coating material 12c on the side that is in contact with the phosphor particle 11b is set to high, or the refractive index of the coating material 12c on the outside is set to low. Accordingly, light emitted from the phosphor particle 11b can easily outgo. Although FIG. 12(c) shows the example in which the coating material is composed of two layers, it needless to say that it may be composed of three or more layers. In the examples of the above figures, although the cross-sectional view of phosphor particle is shown in a substantially circular shape, the second embodiment of the present invention is not limited to this example. The coating material 12e can coat the phosphor particles 11c with various shapes as shown in FIG. 12(d). For example, depending on growth conditions or growth state of phosphor particles, they may have a polygonal shape, or a nonuniform and irregular shape. Additionally, even the phosphor with fracture surfaces can be used for the above embodiment.

THIRD EMBODIMENT

Figure 13:
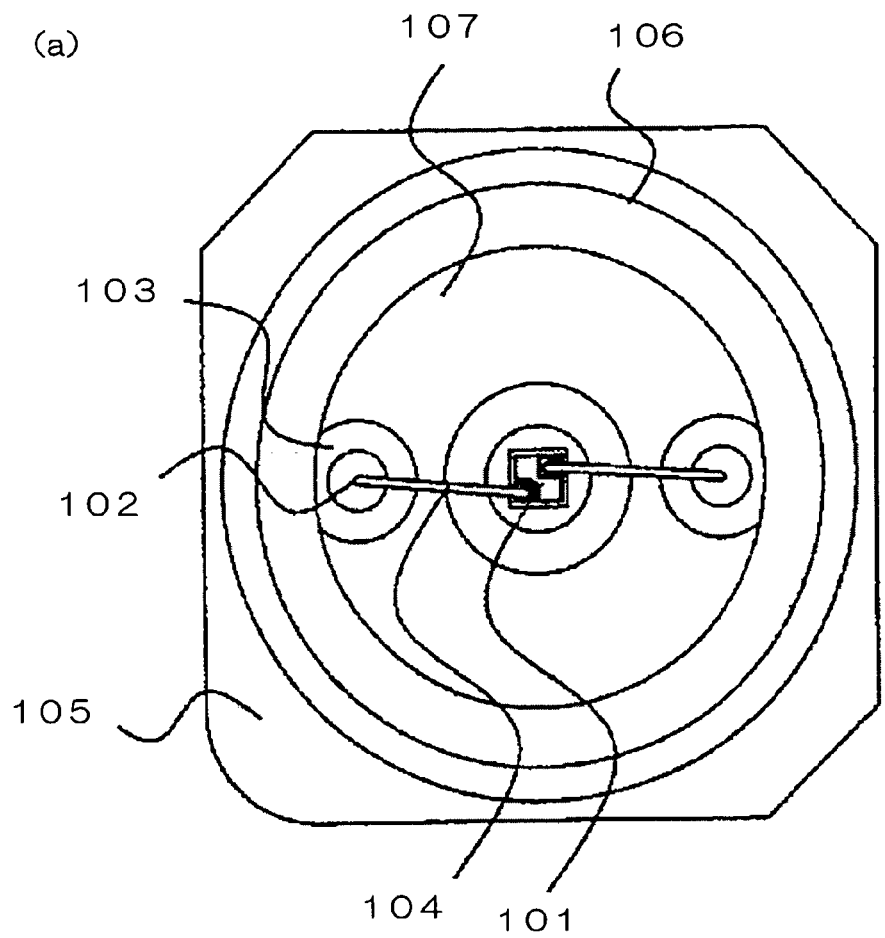
FIG. 13 is a schematic view showing a light emitting apparatus according to a third embodiment of the present invention.
Figure 13:
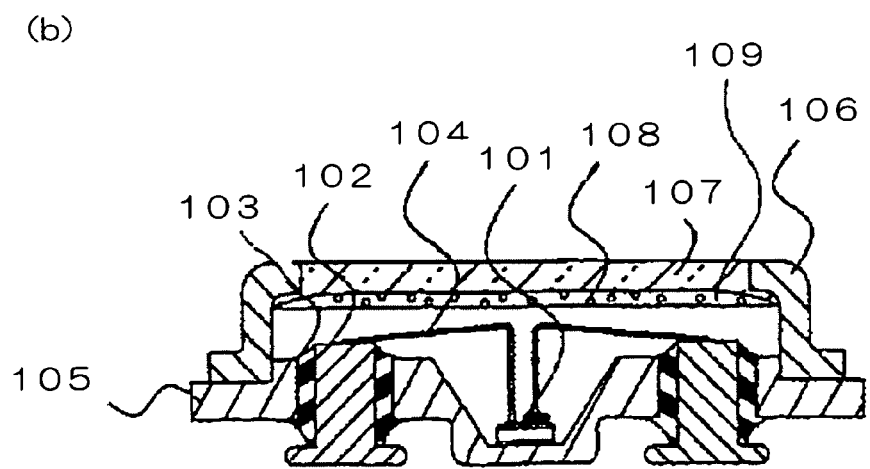

With reference to FIG. 13, a light emitting apparatus according to a third embodiment of the present invention is now described. A phosphor member used for the light emitting apparatus according to the third embodiment is same as the phosphor member in the second embodiment. Since the difference in the light emitting apparatus according to the second embodiment is only the structure of the light emitting apparatus, only the structure of the light emitting apparatus according to the third embodiment will be described herein.

A light emitting element 101, which has an InGaN group semiconductor layer with light emission peak of 460 nm in the blue range as a light emitting layer, is used. A p-type semiconductor layer and an n-type semiconductor layer (not shown) are formed in the light emitting element 101. The conductive wires 104 connected to lead electrodes 102 are formed on the p-type semiconductor layer and the n-type semiconductor layer. An insulating mold material 103 is formed so as to cover the peripheral of the lead electrode 102, and prevents a short circuit. A transparent window portion 107 is disposed above the light emitting element 101 so as to extend from a lid 106 on the upper part of a package 105. A transparent material 109 uniformly including a phosphor 108 is applied to substantially the whole interior surface of the transparent window portion 107 as a phosphor member 110.

In the light emitting apparatus described above, although the example in which the nitride group phosphor coated with the coating material containing an N element is used is shown as a phosphor member, other phosphors, such as a YAG group phosphor represented by the composition formula $(Y, Gd)_3 (Al, Ga)_5 O_{12}$ may be used. In this case, it is also possible to properly coat other phosphors with the coating material.

Thermal Treatment Conditions

After the phosphor is coated, the coating can be more uniform by placing the coated phosphor in a proper atmosphere such that the state of the surface of the phosphor can be close to the state before coating, thus, it is possible to provide more effective coating. Although atmospheres to be selected are different depending on phosphors, it is necessary to select an atmosphere which has reactivity to some extent such that a by-product in the coating volatilizes, and such that the phosphor does not decompose, deteriorate in the atmosphere.

The temperature in thermal treatment needs to be sufficient high to volatilize the by-product in the coating but to be low to a certain extent such that the phosphor is not damaged. The temperature in thermal treatment is preferably 150° C. to 500° C., is more preferably 200° C. to 400° C., and is most preferably 350° C. As the temperature in thermal treatment is relatively low, volatilization efficiency of by-product is also low. But, the treatment is performed in a mild condition for long time, for example 3 to 10 hours, thus, it is possible to volatilize the by-product with minimizing damage to the phosphor.

A phosphor 21 shown in FIG. 2 is coated on its surface with a thin film-shaped coating 22 to prevent deterioration of the phosphor due to external factors, such as heat, humidity and ultraviolet rays. In addition, this prevents that ions dissolved from the surface of the phosphor affect other members of the semiconductor light emitting element. The thickness of the coating 22 is preferably 10 nm or more and 100 nm or less, is more preferably 10 nm or more and 50 nm or less. The reason is that, in the case of 10 nm or less, the coating does not effectively function, and in the case of 100 nm or more, the luminous intensity of the phosphor reduces. Additionally, a phosphor 21B shown in FIG. 3 is coated with aggregation of the very small particles as coating 22B as shown in the enlarged view.

Chemical Vapor Deposition

With reference to FIGS. 4 and 5, an exemplary method for coating the phosphor by chemical vapor deposition is now described. The method of coating by a chemical vapor process is not limited to the following method. Chemical vapor deposition (CVD) is also referred to as vapor-phase-epitaxy, chemical vapor-phase deposition, and so on. This method is a method of coating in which a vapor phase material is used. In this method, the surface of very small particle is covered with a reaction product by reacting a gaseous reaction precursor and a gaseous coreaction material on the surface of the very small particle. Coating by chemical vapor deposition can provide uniform coating.

The reaction precursor is a metal material for coating with a metallic compound in chemical vapor deposition, and is a substance for reacting with the coreaction material discussed later to obtain a target metallic compound. Specifically, a metal alkyl, a metal halide, and so on, can be used.

Silanes, such as TMA, TEA, mono silane ($SiH_4$) and disilane ($Si_2H_6$), TMG, TMI, $Y(DPM)_3$, $Gd(DPM)_3$, and so on can be given as a rare earth metal which can be used in the present invention.

The coreaction material is a substance which allows the metallic compound as the reaction precursor provided to the surface of very small particle to react thereby producing a target metallic compound. Specifically, oxygen, ammonia, and so on, can be used.

FIG. 4 is a schematic view showing an apparatus for chemical vapor deposition. In the apparatus shown in this figure, a phosphor 32 is put in an inclined reaction vessel 31. An introduction tube 33, which introduces the reaction precursor, is inserted into the phosphor 32. An introduction tube 34, which introduces the coreaction material, is led to a high temperature portion 37 heated by a heater 35. The reaction precursor may be diluted by an inert gas. A stirring rod 38 is attached in the bottom of the reaction vessel 31. The phosphor 32 is continuously stirred by rotation of the reaction vessel 31 during reaction. The total flow rate of the gases introduced from the introduction tube 33 is set to the extent that the phosphor 32 rises into the high temperature portion 37. A low temperature portion 36 is held at low temperature such that the reaction precursor is sufficiently absorbed on the surface of the phosphor. The high temperature portion 37 is held at least the temperature where the reaction precursor decomposes. The phosphor 32 is circulated between the low-temperature portion 36 and the high-temperature portion 37. Thus, the adsorption of the reaction precursor onto the surface of the phosphor in the low-temperature portion, and the reaction with the coreaction material in the high temperature portion are repeated. If the low-temperature portion becomes high temperature, the reaction precursor will decompose, On the other hand, if the high-temperature portion becomes low temperature, the reaction precursor insufficiently will decompose, thus, a by-product will be mixed into the coating.

In an apparatus shown in FIG. 5 as another exemplary apparatus for chemical vapor deposition, a phosphor 42 is put in an inclined reaction vessel 41. An introduction tube 43, which introduces the reaction precursor, is inserted into the phosphor 42. An introduction tube 44, which introduces the coreaction material, is led slightly upward of the phosphor 42. Both the reaction precursor and the coreaction material are introduced into a common temperature portion heated by a heater 45. The reaction precursor may be diluted by an inert gas. A stirring rod 48 is attached in the bottom of the reaction vessel 41. The phosphor 42 is continuously stirred by rotation of the reaction vessel 41 during reaction. The total flow rate of the gases introduced from the introduction tube 43 is set to the extent that the phosphor 42 slightly rises. The portion heated by the heater 45 is held at low temperature such that reaction precursor does not spontaneously decompose and sufficiently adsorbed onto the surface of the phosphor. The phosphor slightly and continuously rises, thus, the adsorption of the reaction precursor onto the surface of the phosphor, and the reaction with the coreaction material are repeated. If the heated portion becomes high temperature, the reaction precursor leaving away from the surface of the phosphor will reacts with the coreaction material and an aggregated product produced by the reaction will adheres onto the surface of the phosphor. This causes nonuniform coating.

EXAMPLE 1

The phosphor was coated by using the apparatus for producing a phosphor of FIG. 5. An LED was produced as a light emitting apparatus. Its characteristics were measured. In FIG. 5, a vessel made of a stainless steel alloy, 30 g of silicon nitride phosphor ($Sr_2Si_5N_8$:Eu), trimethyl aluminum (TMA), and oxygen were used as the reaction vessel 41, the phosphor 42, the reaction precursor, and the coreaction material, respectively. TMA was stored in a bubbler 410 held at 27° C. in a thermostat 49, and was introduced into the introduction tube 43 by nitrogen bubbling. In addition, a pipe 411 for nitrogen was separately provided for dilution of TMA, and joined a pipe for TMA immediately in front of the introduction tube 43. While the temperature of the heater 45 was held at 50° C., TMA/$N_2$, $N_2$, and $O_2$ were continuously flowed at flow rates 0.1 L/min, 0.25 L/min, and 0.25 L/min, respectively, for reaction for 4 hours.

Figure 6:
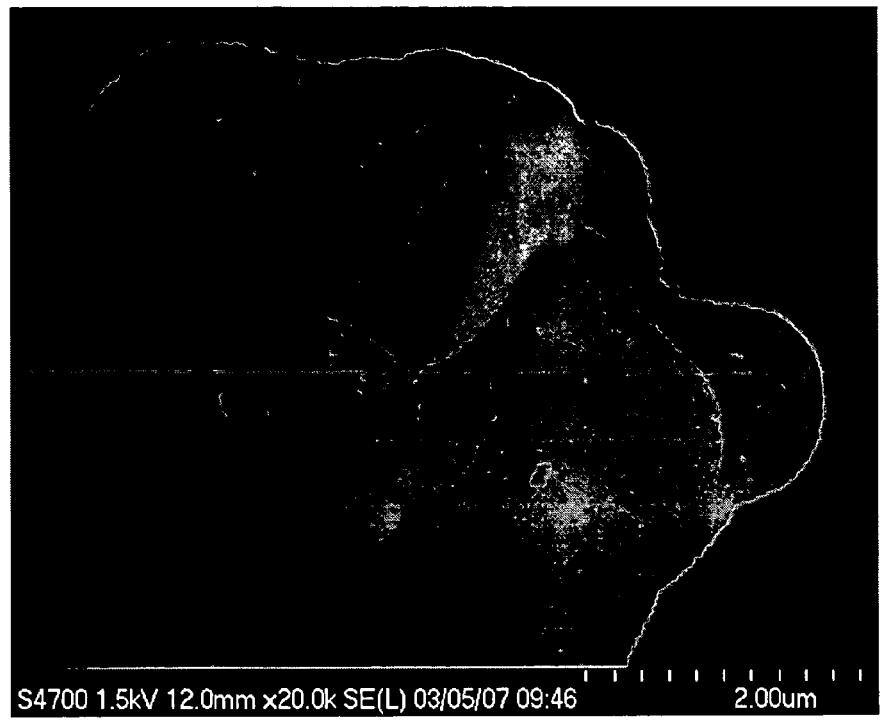
FIG. 6 is an electron microscope photograph showing the surface state of the phosphor before and after coating according to the first embodiment.
Figure 6:
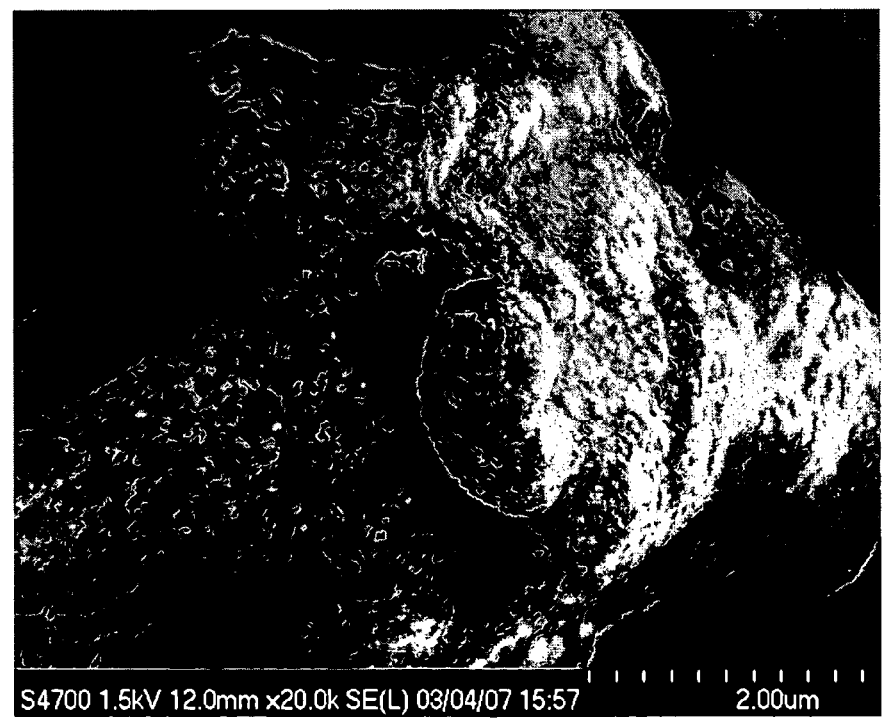
Figure 7:
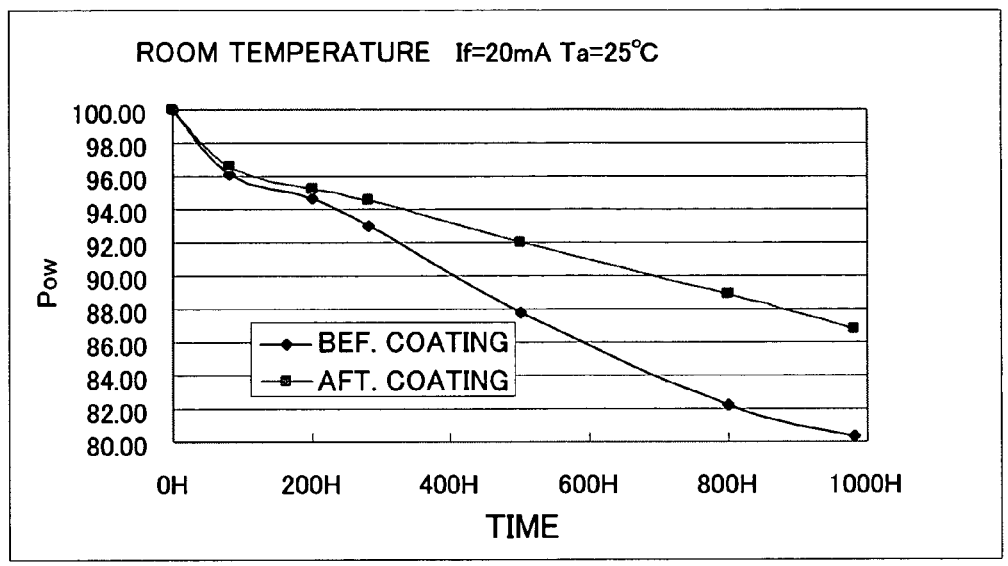
FIG. 7 is a graph showing the life characteristics of the phosphor according to the first embodiment.
Figure 8:
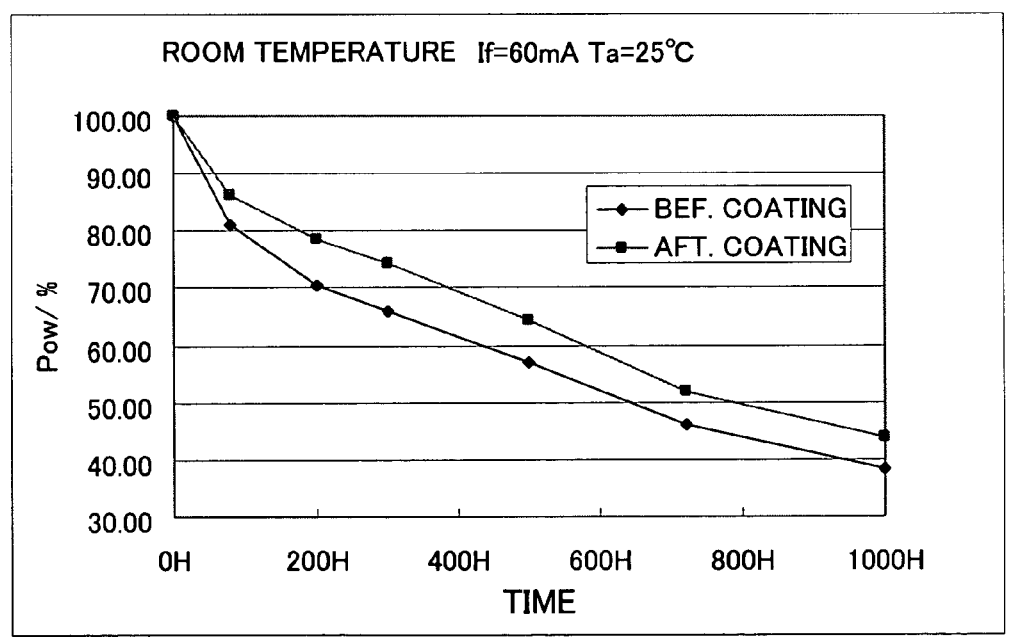
FIG. 8 is a graph showing the life characteristics of the phosphor according to the first embodiment.
Figure 9:
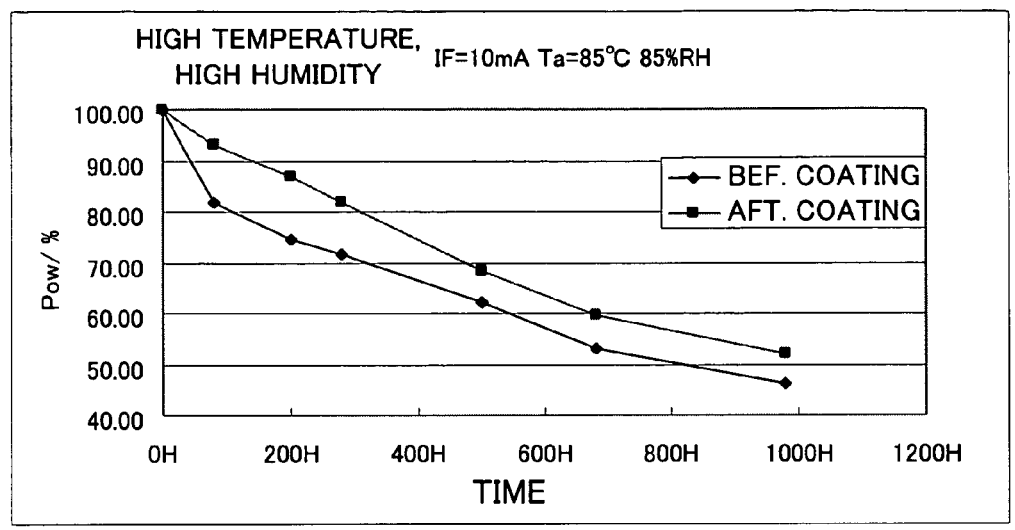
FIG. 9 is a graph showing the life characteristics of the phosphor according to the first embodiment.

FIG. 6 is an electron microscope (SEM) photograph showing the surface state of the phosphor before and after coating according to the first embodiment. As illustrated, (a) shows the surface state of the phosphor before coating, while (b) shows the surface state of the phosphor after coating. According to the illustration, it was found that alumina ($Al_2O_3$) was substantially uniformly coated on the whole surface of the phosphor after reaction. LEDs using this sample and a sample without being coated were produced, and their life characteristics were investigated at room temperature, and drive currents 20 mA and 60 mA (rated current 20 mA). FIGS. 7 and 8 show their states where the outputs vary as time elapses. As shown in these figures, the maintenance rate of output of the coated sample was 6 to 7% higher than the sample without being coated. In addition, their life characteristics were investigated at drive currents 20 mA, humidity 85%, and 85° C. FIG. 9 similarly shows their states where the outputs vary as time elapses. As shown in these figures, the maintenance rate of output of the coated sample was 6% higher. The characteristics of the respective phosphors obtained in examples are shown in Table 1. In this case, chromaticity values xy, luminance values Y, BET values, ratios of Al which coats their surfaces, states of coated phosphors visually observed with SEM, and flowabilities of samples were measured as the characteristics of the phosphors. In this case, the luminance values Y are represented as relative values where the luminance value of phosphor before coating is set to 100. ND and "–" show that values or states were not measured or detected. In addition, measured characteristic results of phosphors before coating are similarly shown as comparative examples under respective rows of examples.

TABLE 1

| | | | | | Analysis | Observation | |
| | | Characteristics of Particles | | | Surface | SEM Visual | Sample |
| lot no | x | y | Luminance Y | BET/m2g-1 | Al | Observation | flowability |
| Ex. 1 | 0.629 | 0.363 | 107.5 | 3.5 | 1.20% | Substantially uniformly coated | Good |
| Ex. 2 | 0.632 | 0.36 | 103 | 6.67 | 0.86% | Substantially uniformly coated | Good |
| Bef. Coating | 0.632 | 0.36 | 100 | 0.59 | ND | — | — |
| Ex. 3 | 0.631 | 0.361 | 101.2 | 7.48 | 1.40% | Substantially | Good |

TABLE 1-continued

| | Characteristics of Particles | | | | Analysis Surface | Observation | |
|---|---|---|---|---|---|---|---|
| lot no | x | y | Luminance Y | BET/m2g-1 | Al | SEM Visual Observation | Sample flowability |
| Bef. Coating | 0.629 | 0.363 | 100 | 0.56 | ND | uniformly coated | — |
| Ex. 4 | 0.634 | 0.359 | 103.1 | 18.6 | 1.40% | Substantially uniformly coated | Good |
| Bef. Coating | 0.634 | 0.359 | 100 | 0.4 | ND | — | — |
| Ex. 5 | 0.597 | 0.396 | 99.5 | 8.68 | 0.56% | Substantially uniformly coated Partially particle-shaped | Good |
| Bef. Coating | 0.596 | 0.398 | 100 | 0.71 | ND | — | — |
| Ex. 6 | 0.083 | 0.502 | 103.7 | 6.85 | 1.60% | Thickly adhered | Good |
| Bef. Coating | 0.084 | 0.499 | 100 | 1.30 | ND | — | — |
| Ex. 7 | 0.147 | 0.055 | 99.8 | 2.08 | 0.68% | Substantially uniformly coated | Normal |
| Ex. 8 | 0.147 | 0.055 | 99.7 | 1.18 | 0.68% | Substantially uniformly coated | Normal |
| Bef. Coating | 0.147 | 0.054 | 100 | 1.31 | 0.33% | Substantially uniformly coated | — |
| Ex. 9 | 0.14 | 0.361 | 101.8 | 1.4 | 0.15% | Thickly adhered | Good |
| Bef. Coating | 0.139 | 0.361 | 100 | 0.95 | ND | — | — |

In addition, the charge amounts of 200 mg of particles in the sample were measured. The charge amount before coating was +0.11 μC, while the charge amount after coating was −0.42 μC. 1 g each of samples before and after coating were dispersed in 20 ml of ion-exchanged water, and were continuously stirred, then their electrical conductivities were investigated at every predetermined period. The electrical conductivity of the sample after coating was about 35% of that of the sample before coating. Additionally, the supernatant liquor after this investigation was analyzed, and the solubility was investigated. According to the investigation, remarkable difference in Si elution was found as compared with the phosphor without being coated.

EXAMPLE 2

In FIG. 5, a vessel made of a stainless steel alloy, 50 g of silicon nitride phosphor ($Sr_2Si_5N_8$:Eu), trimethyl aluminum (TMA), and water vapor bubbled with nitrogen were used as the reaction vessel 41, the phosphor 42, the reaction precursor, and the coreaction material, respectively. TMA was stored in the bubbler 410 held at 27° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C., TMA/$N_2$, $N_2$, and $H_2O$ were continuously flowed at flow rates 0.1 L/min, 0.25 L/min, and 0.20 L/min, respectively, and 25° C. for reaction for 8 hours. In investigation of this measurement results, according to its SEM photograph, it was found that alumina was substantially uniformly coated on the surface of the phosphor. The characteristics of the obtained phosphor are shown in Table 1.

EXAMPLE 3

In FIG. 5, a vessel made of a stainless steel alloy, 50 g of silicon nitride phosphor ($Sr_2Si_5N_8$:Eu), trimethyl aluminum (TMA), and oxygen were used as the reaction vessel 41, the phosphor 42, the reaction precursor, and the coreaction material, respectively. TMA was stored in the bubbler 410 held at 27° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50 to 250° C., TMA/$N_2$, $N_2$, and $O_2$ were continuously flowed at flow rates 0.1 L/min, 0.25 L/min, and 0.25 L/min, respectively, for reaction for 6 hours.

According to its SEM photograph, it was found that alumina was substantially uniformly coated on the surface of the phosphor. The characteristics of the phosphor itself are shown in Table 1. The charge amounts of 200 mg of particles in the sample were measured. The charge amount before coating was −0.31 μC, while the charge amount after coating was +0.10 μC.

1 g each of samples before and after coating were dispersed in 20 ml of ion-exchanged water, and were continuously stirred, then their electrical conductivities were investigated at every predetermined period. The electrical conductivity of the sample after coating was about 20% of the sample before coating. Additionally, the supernatant liquor after this investigation was analyzed, and the solubility was investigated. According to the investigation, remarkable difference in Sr and Si elution was found as compared with the phosphor without being coated.

EXAMPLE 4

In FIG. 5, a vessel made of a stainless steel alloy, 25 g of silicon nitride phosphor ((Sr, Ca)$_2$Si$_5$N$_8$:Eu), trimethyl aluminum (TMA), and oxygen were used as the reaction vessel 41, the phosphor 42, the reaction precursor, and the coreaction material, respectively. TMA was stored in a bubbler 110 held at 27° C. in a thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C., TMA/N$_2$, N$_2$, and O$_2$ were continuously flowed at flow rates 0.1 L/min, 0.25 L/min, and 0.25 L/min, respectively, for reaction for 3 hours.

According to its SEM photograph, it was found that alumina was substantially uniformly coated on the surface of the phosphor. The characteristics of the phosphor itself are shown in Table 1. The charge amounts of 200 mg of particles in the sample were measured. The charge amount before coating was −0.34 μC, while the charge amount after coating was +0.10 μC.

1 g each of samples before and after coating were dispersed in 20 ml of ion-exchanged water, and were continuously stirred, then their electrical conductivities were investigated at every predetermined period. The electrical conductivity of the sample after coating was about 20% of that of the sample before coating. Additionally, the supernatant liquor after this investigation was analyzed, and the solubility was investigated. According to the investigation, remarkable difference in Sr and Si elution was found as compared with the phosphor without being coated.

EXAMPLE 5

In FIG. 5, a vessel made of a stainless steel alloy, 20 g of oxynitride phosphor (Ca$_2$Si$_5$N$_8$:Eu), TMA, and oxygen were used as the reaction vessel 41, the phosphor 42, the reaction precursor, and the coreaction material, respectively. TMA was stored in the bubbler 110 held at 25° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C. to 250° C., TMA/N$_2$, N$_2$, and O$_2$ were continuously flowed at flow rates 0.1 L/min, 0.25 L/min, and 0.25 L/min, respectively, for reaction for 1.5 hours.

According to its SEM photograph, it was found that alumina was substantially uniformly coated on the surface of the phosphor. The characteristics of the phosphor itself are shown in Table 1.

EXAMPLE 6

In FIG. 5, a vessel made of a stainless steel alloy, 30 g of oxynitride phosphor (BaSi$_2$O$_2$N$_2$:Eu), TMA, and oxygen were used as the reaction vessel 41, the phosphor 42, the reaction precursor, and the coreaction material, respectively. TMA was stored in the bubbler 110 held at 25° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C. to 25° C., TMA/N2, N2, and O$_2$ were continuously flowed at flow rates 0.1 L/min, 0.25 L/min, and 0.25 L/min, respectively, for reaction for 4 hours.

According to its SEM photograph, it was found that alumina was substantially uniformly coated on the surface of the phosphor. The characteristics of the phosphor itself are shown in Table 1.

EXAMPLE 7

In FIG. 5, a vessel made of a stainless steel alloy, 50 g of BAM phosphor (BaMg$_2$Al$_{16}$O$_{27}$:Eu), TMA, and oxygen were used as the reaction vessel 41, the phosphor 42, the reaction precursor, and the coreaction material, respectively. TMA was stored in the bubbler 110 held at 25° C in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C. to 250° C., TMA/N$_2$, N$_2$, and O$_2$ were continuously flowed at flow rates 0.1 L/min, 0.25 L/min, and 0.25 L/min, respectively, for reaction for 8 hours.

According to its SEM photograph, it was found that alumina was substantially uniformly coated on the surface of the phosphor. The characteristics of the phosphor itself are shown in Table 1.

EXAMPLE 8

In FIG. 5, a vessel made of a stainless steel alloy, 50 g of BAM phosphor (BaMg$_2$Al$_{16}$O$_{27}$:Eu), TMA, and oxygen were used as the reaction vessel 41, the phosphor 42, the reaction precursor, and the coreaction material, respectively. TMA was stored in the bubbler 110 held at 25° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 has held at 50° C. to 250° C., TMA/N$_2$,N$_2$, and O$_2$ were continuously flowed at flow rates 0.1 L/min, 0.25 L/min, and 0.25 L/min, respectively, for reaction for 30 hours.

According to its SEM photograph, it was found that alumina was substantially uniformly coated on the surface of the phosphor. The characteristics of the phosphor itself are shown in Table 1.

EXAMPLE 9

In FIG. 5, a vessel made of a stainless steel alloy, 100 g of afterglow phosphor (SrAl$_4$O$_7$:Eu, Dy), TMA, and oxygen were used as the reaction vessel 41, the phosphor 42, the reaction precursor, and the coreaction material, respectively. TMA was stored in the bubbler 110 held at 25° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C. to 250° C., TMA/N2, N2, and O$_2$ were continuously flowed at flow rates 0.1 L/min, 0.25 L/min, and 0.25 L/min, respectively, for reaction for 12 hours.

According to its SEM photograph, it was found that alumina was substantially uniformly coated on the surface of the phosphor. The characteristics of the phosphor itself are shown in Table 1. The charge amounts of 200 mg of particles in the sample were measured. The charge amount before coating was +0.088 μC, while the charge amount after coating was +0.036 μC.

EXAMPLE 10

An example in which a gadolinium oxide was coated on the phosphor is described, as an example 10. In FIG. 5, a vessel made of a stainless steel alloy, 50 g of silicon nitride phosphor $((Sr_xCa_{1-x})_2Si_5N_8:Eu, 0 \leq x \leq 1.0)$, $Gd(DPM)_3$ (gadolinium tris-dipivaloylmethanate), and oxygen were used as the reaction vessel 41, the phosphor 42, the reaction precursor, and the coreaction material, respectively. $Gd(DPM)_3$ was stored in the bubbler 110 held at 50° C. to 150° C. in the thermostat 49, and was introduced into the introduction tube 43 by nitrogen bubbling. In addition, the pipe 411 for nitrogen was separately provided for dilution of $Gd(DPM)_3$, and joined the pipe for TMA immediately in front of the introduction tube 43. While the temperature of the heater 45 was held at 50° C. to 250° C., $Gd(DPM)_3/N_2$, $N_2$, and $O_2$ were flowed at flow rates 0.1 L/min, 0.25 L/min, and 0.25 L/min, respectively, for reaction for a predetermined period. Thus, a gadolinium oxide was coated on the phosphor.

EXAMPLE 11

An example in which an yttrium oxide was coated on the phosphor is described, as an example 11. In FIG. 5, a vessel made of a stainless steel alloy, 50 g of silicon nitride phosphor $((Sr_xCa_{1-x})_2Si_5N_8:Eu, 0 \leq x \leq 1.0)$, $Y(DPM)_3$ (yttrium tris-dipivaloylmethanate), and oxygen were used as the reaction vessel 41, the phosphor 42, the reaction precursor, and the coreaction material, respectively. $Y(DPM)_3$ was stored in the bubbler 110 held at 50° C. to 150° C. in the thermostat 49, and was introduced into the introduction tube 43 by nitrogen bubbling. In addition, the pipe 411 for nitrogen was separately provided for dilution of $Y(DPM)_3$, and joined the pipe for $Y(DPM)_3$ immediately in front of the introduction tube 43. While the temperature of the heater 45 was held at 50° C. to 250° C., $Y(DPM)_3/N_2$, $N_2$, and $O_2$ were flowed at flow rates 0.1 L/min, 0.25 L/min, and 0.25 L/min, respectively, for reaction for a predetermined period. Thus, an yttrium oxide was coated on the phosphor.

EXAMPLE 12

Moreover, an example in which an aluminium nitride or aluminum oxynitride was coated on the phosphor is described, as an example 12. In FIG. 5, a vessel made of a stainless steel alloy, 50 g of silicon nitride phosphor $((Sr_xCa_{1-x})_2Si_5N_8:Eu, 0 \leq x \leq 1.0)$, TMA, and ammonia were used as the reaction vessel 41, the phosphor 42, the reaction precursor, and the coreaction material, respectively. TMA was stored in the bubbler 110 held at 25° C. in the thermostat 49, and was introduced into the introduction tube 43 by nitrogen bubbling. In addition, the pipe 411 for nitrogen was separately provided for dilution of TMA, and joined the pipe for TMA immediately in front of the introduction tube 43. While the temperature of the heater 45 was held at 50° C. to 250° C., $TMA/N_2$, $N_2$, and $NH_3$ were flowed at flow rates 0.1 L/min, 0.25 L/min, and 0.25 L/min, respectively, for reaction for a predetermined period. Thus, an aluminum nitride or aluminum oxynitride was coated on the phosphor.

INDUSTRIAL APPLICABILITY

A light emitting apparatus, a phosphor, and a method for producing a phosphor according to the present invention can be applied to a light source for lighting, an LED display, a back light source for a mobile phone, etc., a signal light, an illuminated switch, a stop lamp an automobile, various sensors, and various indicators, and so on.

The invention claimed is:

1. A light emitting apparatus comprising a light emitting element, and a phosphor which absorbs a part of light emitted from said light emitting element and converts it into light with a different wavelength, wherein:
    the surface of said phosphor is coated with a coating member which is made of a material that is different from the phosphor;
    said coating member is made of metal nitride or metal oxynitride; and
    a BET value of said coated phosphor is 1.0 to 10 times larger than a BET value of said phosphor before coating.

2. The light emitting apparatus according to claim 1, wherein said coating member coats the surface of said phosphor so as to have a substantially smooth film.

3. The light emitting apparatus according to claim 1, wherein said coating member is formed such that a large number of fine particles, which are relatively smaller than said phosphors, aggregate to coat the whole surface of said phosphor.

4. The light emitting apparatus according to claim 1, wherein said coating member contains at least one metallic element selected from the group consisting of Al, Si, and In, Ga and the other rare earth elements.

5. The light emitting apparatus according to claim 1, wherein the phosphor before coating has hydration characteristics.

6. The light emitting apparatus according to claim 1, wherein said phosphor is an alkaline-earth silicon nitride phosphor.

7. The light emitting apparatus according to claim 1, wherein said phosphor is an alkaline-earth silicon oxynitride phosphor.

8. The light emitting apparatus according to claim 1, wherein the average thickness of said coating is 10 nm to 500 nm.

9. The light emitting apparatus according to claim 1, wherein said coating is formed in chemical vapor deposition.

10. A phosphor for a light emitting element which absorbs a part of light emitted from the light emitting element and converts it into light with different wavelength, wherein:
    the surface of said phosphor is coated with a coating member which is made of a material different from the phosphor;
    said coating member is made of metal nitride or metal oxynitride; and
    a BET value of said coated phosphor is 1.0 to 10 times larger than a BET value of said phosphor before coating.

11. The phosphor for a light emitting element according to claim 10, wherein said coating member coats the surface of said phosphor so as to have a substantially smooth film.

12. The phosphor for a light emitting element according to claim 10, wherein said coating member is formed such that a large number of fine particles, which are relatively smaller than the phosphors, aggregate to coat the whole surface of said phosphor.

13. The phosphor for a light emitting element according to claim 10, wherein said coating member contains at least one metallic element selected from the group consisting of Al, Si, and In, Ga and rare earth elements.

14. The phosphor for a light emitting element according to claim 10, wherein the phosphor before coating has hydration characteristics.

15. The phosphor for a light emitting element according to claim 10, wherein said phosphor is an alkaline-earth silicon nitride phosphor.

16. The phosphor for a light emitting element according to claim 10, wherein said phosphor is an alkaline-earth silicon oxynitride phosphor.

17. The phosphor for a light emitting element according to claim 10, wherein the average thickness of said coating is 10 nm to 500 nm.

18. The phosphor for a light emitting element according to claim 10, wherein said phosphor is charged to a negative surface potential before coating.

19. The phosphor for a light emitting element according to claim 10, wherein said coating is formed in a chemical vapor deposition process.

20. A method for producing a phosphor for a light emitting element which absorbs a part of light emitted from the light emitting element and converts it into light with different wavelength, the method comprising:
absorbing a reaction precursor onto the surface of the phosphor; and
coating the surface of the phosphor with a metal nitride by reacting said reaction precursor with a co-reaction material in chemical vapor deposition,
wherein a BET value of said coated phosphor is 1.0 to 10 times larger than a BET value of said phosphor before coating.

21. The method for producing a phosphor for a light emitting element according to claim 20, wherein said reaction precursor is an organic metal.

22. The method for producing a phosphor for a light emitting element according to claim 21, wherein said organic metal contains at least one metallic element selected from the group consisting of Al, Si, and In, Ga and rare earth elements.

23. The method for producing a phosphor for a light emitting element according to claim 20, wherein said co-reaction material is any of oxygen, water vapor and ammonia.

24. The method for producing a phosphor for a light emitting element according to claim 20, wherein the method further comprises thermally treating the phosphor for a light emitting element after coating in a non-oxidation atmosphere.

25. The method for producing a phosphor for a light emitting element according to claim 24, wherein the temperature range of said thermal treatment is 150° C. to 1000° C., and the time is 3 to 10 hours.

26. A nitride group phosphor which converts at least a part of light with first emission spectrum into light with at least one second emission spectrum in the range different from said first emission spectrum, comprising:
a nitride group phosphor material containing N (where N is nitrogen); and
a coating material which is made of any of metal oxide, metal nitride and metal oxynitride and coats said nitride group phosphor material such that the BET value of the coated phosphor is 1.0 to 10 times larger than BET value before coating.

27. The nitride group phosphor according to claim 26, wherein said coating material is a metal nitride group material, or a metal oxynitride group material.

28. The nitride group phosphor according to claim 26, wherein said coating material forms a micro capsule.

29. The nitride group phosphor according to claim 26, wherein said coating material has a multi-layer structure formed of a plurality of different materials.

30. The nitride group phosphor according to claim 29, wherein said coating material of the multi-layer structure has a high refractive index on said phosphor side, and a low refractive index on the surface side.

31. The nitride group phosphor according to claim 26, wherein said phosphor is a nitride group phosphor represented by L-M-N:R or L-M-O—N:R (where L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element).

32. The nitride group phosphor according to claim 26, wherein said phosphor is represented by $L_xM_yN_{\{(2/3)x+(4/3)y\}}$:R, or $L_xM_yO_zN_{\{(2/3)x+(4/3)y-(2/3)z\}}$:R (where L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), and has a crystal structure.

33. The nitride group phosphor according to claim 26, wherein said phosphor is represented by $L_xM_yN_{\{(2/3)x+(4/3)y\}}$:R, or $L_xM_yO_zN_{\{(2/3)x+(4/3)y-(2/3)z\}}$:R (where $0.5 \leq x \leq 3$, $1.5 \leq y \leq 8$, $0 \leq z \leq 3$; L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), and has a crystal structure.

34. The nitride group phosphor according to claim 26, wherein said phosphor is represented by $L_xM_yN_{\{(2/3)x+(4/3)y\}}$:R, or $L_xM_yO_zN_{\{(2/3)x+(4/3)y-(2/3)z\}}$:R (where x=2, $4.5 \leq y \leq 6.0$, $0.01 < z < 1.5$; x=1, $6.5 \leq y \leq 7.5$, $0.01 < z < 1.5$; or x=1, $1.5 < y \leq 2.5$, $1.5 < z < 2.5$; L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), and has a crystal structure.

35. The nitride group phosphor according to claim 26, wherein said phosphor is represented by $Ca_2Si_5O_{0.1}N_{7.9}$:Eu, $Sr_2Si_5O_{0.1}N_{7.9}$:Eu, $(Sr_{0.5}Ca_{0.5})_2Sr_5O_{0.1}N_{7.9}$:Eu, $SrSi_2O_2N_2$:Eu, or $CaSi_2O_2N_2$:Eu, and has a crystal structure.

36. The nitride group phosphor according to claim 32, wherein the crystal structure of said phosphor is a monoclinic system or orthorhombic system.

37. The nitride group phosphor according to claim 26, wherein said phosphor contains a B element.

38. A light emitting apparatus comprising a phosphor member composed of a transparent material containing a nitride group phosphor according to claim 26, and a light emitting element, wherein said phosphor member absorbs a part of light emitted from said light emitting element and emits light with different wavelength.

39. A nitride group phosphor which converts at least a part of light with first emission spectrum into light with at least one second emission spectrum in the range different from said first emission spectrum, comprising:
a nitride group phosphor material which includes an N element and is charged to a negative surface potential before coating of the phosphor; and
a coating material which is made of any of metal oxide, metal nitride and metal oxynitride and coats said nitride group phosphor material,
wherein a BET value of said coated phosphor is 1.0 to 10 times larger than a BET value of said phosphor before coating.

40. The nitride group phosphor according to claim 39, wherein said coating material is a metal nitride group material, or a metal oxynitride group material.

41. The nitride group phosphor according to claim 39, wherein said coating material forms a micro capsule.

42. The nitride group phosphor according to claim 39, wherein said coating material has a multi-layer structure formed of a plurality of different materials.

43. The nitride group phosphor according to claim 42, wherein said coating material of the multi-layer structure has a high refractive index on said phosphor side, and a low refractive index on the surface side.

44. The nitride group phosphor according to claim 39, wherein said phosphor is a nitride group phosphor represented by L-M-N:R or L-M-O—N:R (where L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element).

45. The nitride group phosphor according to claim 42, wherein said phosphor is represented by $L_xM_yN_{\{(2/3)x+(4/3)y\}}$:R, or $L_xM_yO_zN_{\{(2/3)x+(4/3)y-(2/3)z\}}$:R (where L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), and has a crystal structure.

46. The nitride group phosphor according to claim 39, wherein said phosphor is represented by $L_xM_yN_{\{(2/3)x+(4/3)y\}}$:R, or $L_xM_yO_zN_{\{(2/3)x+(4/3)y-(2/3)z\}}$:R (where $0.5 \leq x \leq 3$, $1.5 \leq y \leq 8$, $0 \leq z \leq 3$; L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), and has a crystal structure.

47. The nitride group phosphor according to claim 39, wherein said phosphor is represented by $L_xM_yN_{\{(2,3)x+(4/3)y\}}$:R, or $L_xM_yO_zN_{\{(2/3)x+(4/3)y-(2/3)z\}}$:R (where x=2, $4.5 \leq y \leq 6.0$, $0.01<z<1.5$; x=1, $6.5 \leq y \leq 7.5$, $0.01<z<1.5$; or x=1, $1.5 \leq y \leq 2.5$, $1.5 \leq z \leq 2.5$; L contains at least one element selected from the group consisting of Be, Mg, Ca, Sr, Ba, and Zn, M contains at least one element selected from the group consisting of C, Si, Ge, Sn, Ti, Zr, and Hf, N is nitrogen, O is oxygen, and R is a rare earth element), and has a crystal structure.

48. The nitride group phosphor according to claim 39, wherein said phosphor is represented by $Ca_2Si_5O_{0.1}N_{7.9}$:Eu, $Sr_2Si_5O_{0.1}N_{7.9}$:Eu, $(Sr_{0.5}Ca_{0.5})_2Sr_5O_{0.1}N_{7.9}$:Eu, $SrSi_2O_2N_2$:Eu, or $CaSi_2O_2N_2$:Eu, and has a crystal structure.

49. The nitride group phosphor according to claim 45, wherein the crystal structure of said phosphor is a monoclinic system or orthorhombic system.

50. The nitride group phosphor according to claim 39, wherein said phosphor contains a B element.

51. A light emitting apparatus comprising a phosphor member composed of a transparent material containing a nitride group phosphor according to claim 39, and a light emitting element, wherein said phosphor member absorbs a part of light emitted from said light emitting element and emits light with different wavelength.

\* \* \* \* \*